US010229980B2

(12) United States Patent
Yonekura

(10) Patent No.: US 10,229,980 B2
(45) Date of Patent: Mar. 12, 2019

(54) SEMICONDUCTOR DEVICE

(71) Applicant: LAPIS SEMICONDUCTOR CO., LTD., Kanagawa (JP)

(72) Inventor: Tomoko Yonekura, Miyazaki (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/724,018

(22) Filed: Oct. 3, 2017

(65) Prior Publication Data

US 2018/0097080 A1   Apr. 5, 2018

(30) Foreign Application Priority Data

Oct. 4, 2016 (JP) .................. 2016-196234

(51) Int. Cl.
| | | |
|---|---|---|
| *H01L 23/528* | (2006.01) | |
| *H01L 29/423* | (2006.01) | |
| *H01L 23/31* | (2006.01) | |
| *H01L 29/739* | (2006.01) | |
| *H01L 29/78* | (2006.01) | |
| *H01L 23/00* | (2006.01) | |
| *H01L 29/40* | (2006.01) | |
| *H01L 29/417* | (2006.01) | |
| *H01L 29/06* | (2006.01) | |

(52) U.S. Cl.
CPC ...... *H01L 29/4238* (2013.01); *H01L 23/3157* (2013.01); *H01L 24/03* (2013.01); *H01L 24/05* (2013.01); *H01L 29/0619* (2013.01); *H01L 29/0638* (2013.01); *H01L 29/404* (2013.01); *H01L 29/417* (2013.01); *H01L 29/7395* (2013.01); *H01L 29/7802* (2013.01); *H01L 2224/02166* (2013.01); *H01L 2224/0382* (2013.01); *H01L 2224/05558* (2013.01); *H01L 2924/13055* (2013.01); *H01L 2924/13091* (2013.01)

(58) Field of Classification Search
CPC ................................ H01L 24/05; H01L 24/06
See application file for complete search history.

(56) References Cited

U.S. PATENT DOCUMENTS

2017/0229552 A1\*   8/2017   Fujita ................... H01L 29/402

FOREIGN PATENT DOCUMENTS

| JP | H0917777 A | 1/1997 |
|---|---|---|
| JP | H09129589 A | 5/1997 |

\* cited by examiner

*Primary Examiner* — Thomas L Dickey
(74) *Attorney, Agent, or Firm* — Volentine, Whitt & Francos, PLLC

(57) ABSTRACT

A semiconductor device including a semiconductor substrate; a conductive film covering a front face of the semiconductor substrate, a front face of the conductive film having plural straight-line shaped concave portions disposed in parallel to each other; and a protecting film covering the front face of the conductive film, the protecting film having an opening that has an edge forming an angle with the plural concave portions of greater than 0° and less than 90°, and that partially exposes the conductive film.

11 Claims, 22 Drawing Sheets

SEMICONDUCTOR DEVICE

CROSS-REFERENCE TO RELATED APPLICATION

This application claims priority under 35 USC 119 from Japanese Patent Application No. 2016-196234, filed on Oct. 4, 2016, the disclosure of which is incorporated by reference herein.

BACKGROUND

Technical Field

The present disclosure relates to a semiconductor device.

Related Art

In a semiconductor device configuring a power semiconductor device, such as a power metal-oxide-semiconductor field-effect transistor (MOSFET) or an insulated gate bipolar transistor (IGBT), a protecting film configured by an insulator such as polyimide is provided on the outermost face of the semiconductor device.

As technology related to patterning of polyimide films that function as protecting films, for example, Japanese Patent Application Laid-Open (JP-A) No. H09-129589 discloses a polyimide film patterning method including: forming a polyimide film on a substrate, forming a resist film on the polyimide film; forming a resist pattern by developing the resist film using a developer fluid after exposing the resist film; and etching the polyimide film by using the developer fluid for the resist film, with the resist pattern serving as a mask.

Further, JP-A No. H09-17777 discloses a semiconductor device manufacturing method that includes, after patterning by developing and etching a polyimide precursor resin and a positive resist, curing the polyimide precursor resin by heat treatment in a state in which the positive resist remains, and then, removing the etching residue of the positive resist and the polyimide by dry etching using the positive resist serving as a mask.

A power semiconductor device such as a power MOSFET or IGBT is configured including: plural gates extending in straight lines disposed parallel to each other on a front face of a semiconductor substrate; a conductive film that covers the front face of the semiconductor substrate so as to bury the plural gates; and a protecting film configured by an insulator such as polyimide that includes an opening where the conductive film is partially exposed. In such a semiconductor device, undulations occur on the semiconductor substrate due to providing plural gates extending in straight lines disposed in parallel to each other on the front face of the semiconductor substrate, and plural concave portions (grooves) extending in straight lines along the extension direction of the plural gates are formed on the front face of the conductive film as a result of the undulations. The protecting film is formed by applying a resin such as polyimide to the front face of the conductive film, which has plural concave portions (grooves), and then, the opening is formed in the protecting film using photolithography. A resist mask having a pattern corresponding to the opening is formed on the front face of the protecting film, and the opening is formed by etching the protecting film through the resist mask. Note that a developer fluid for the resist mask can be employed as an etchant for the protecting film. A typical shape for the opening of the protecting film is a square or rectangle having edges parallel to the extension direction of the plural gates, namely, the extension direction of the plural concave portions formed on the front face of the conductive film.

However, in semiconductor devices having such a structure, string-like protecting film residue remains on the front face of the exposed conductive film in the opening of the protecting film at a stage at which thermal curing treatment of the protecting film has completed. In a case in which wires are bound to the front face of the conductive film exposed in the opening of the protecting film, deficient bonding of the wire may occur, if protecting film residue adheres to the front face of the conductive film. Further, in a case in which an external connection terminal is formed on the front face of the conductive film, deficient connection between the conductive film and the external connection terminal may occur if protecting film residue adheres to the front face of the conductive film.

SUMMARY

The present disclosure provides a semiconductor device that may suppress production of protecting film residue.

A first aspect of the present disclosure is a semiconductor device including: a semiconductor substrate; a conductive film covering a front face of the semiconductor substrate, a front face of the conductive film having plural straight-line shaped concave portions disposed in parallel to each other; and a protecting film covering the front face of the conductive film, the protecting film having an opening that has an edge forming an angle with the plural concave portions of greater than 0° and less than 90°, and that partially exposes the conductive film.

A second aspect of the present disclosure is a semiconductor device including: a semiconductor substrate; a conductive film covering a front face of the semiconductor substrate, a front face of the conductive film having plural straight-line shaped concave portions disposed in parallel to each other; and a protecting film covering the front face of the conductive film and including an opening having an edge running along the plural concave portions while meandering so as to repeatedly intersect with at least one of the plural concave portions.

According to the above aspects, the present disclosure may provide a semiconductor device that may suppress production of protecting film residue.

BRIEF DESCRIPTION OF THE DRAWINGS

Exemplary embodiments will be described in detail based on the following figures, wherein.

DETAILED DESCRIPTION

Figure 1A:
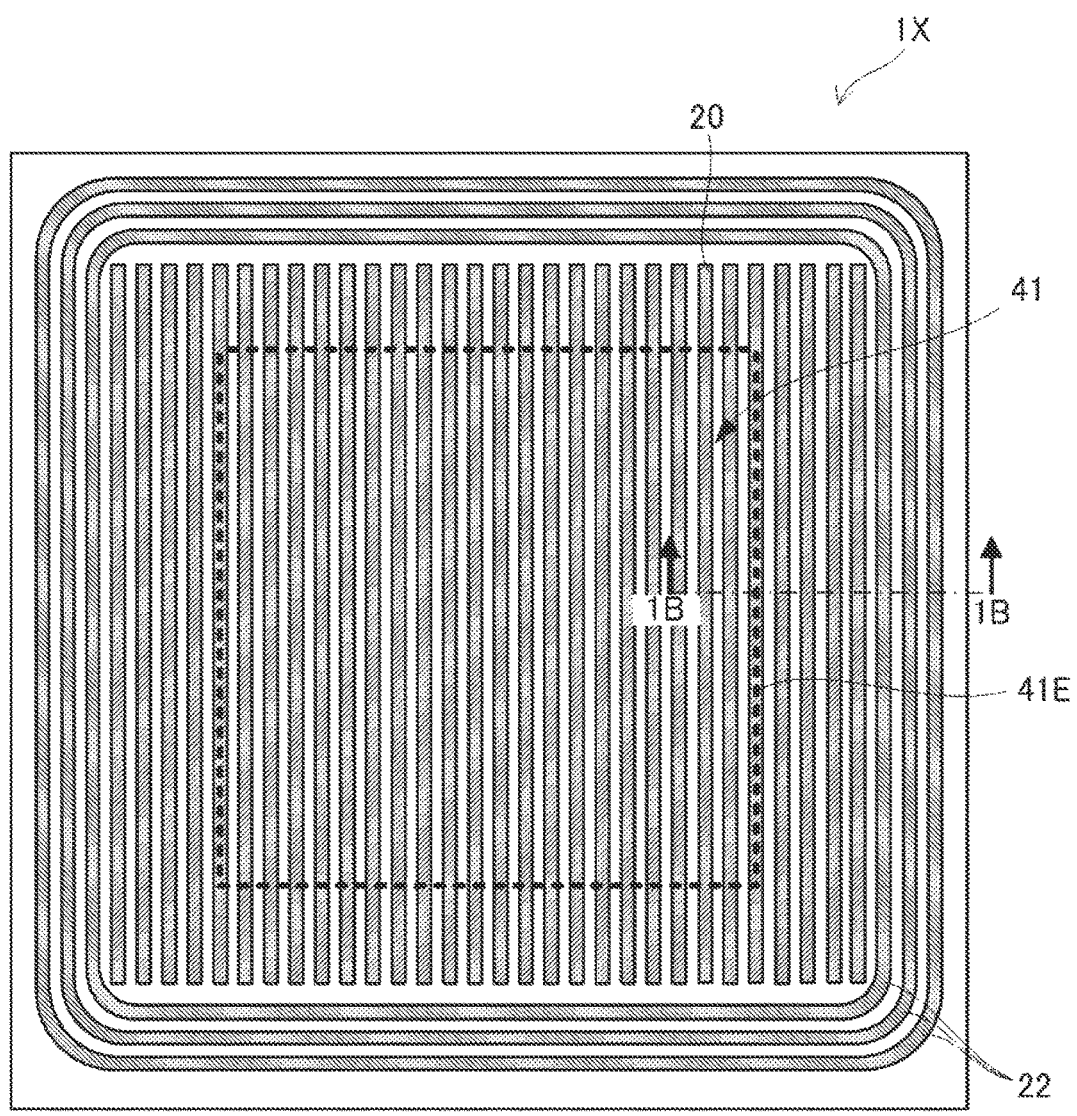
FIG. 1A is a plan view illustrating a configuration of a semiconductor device according to a comparative example.
Figure 1B:
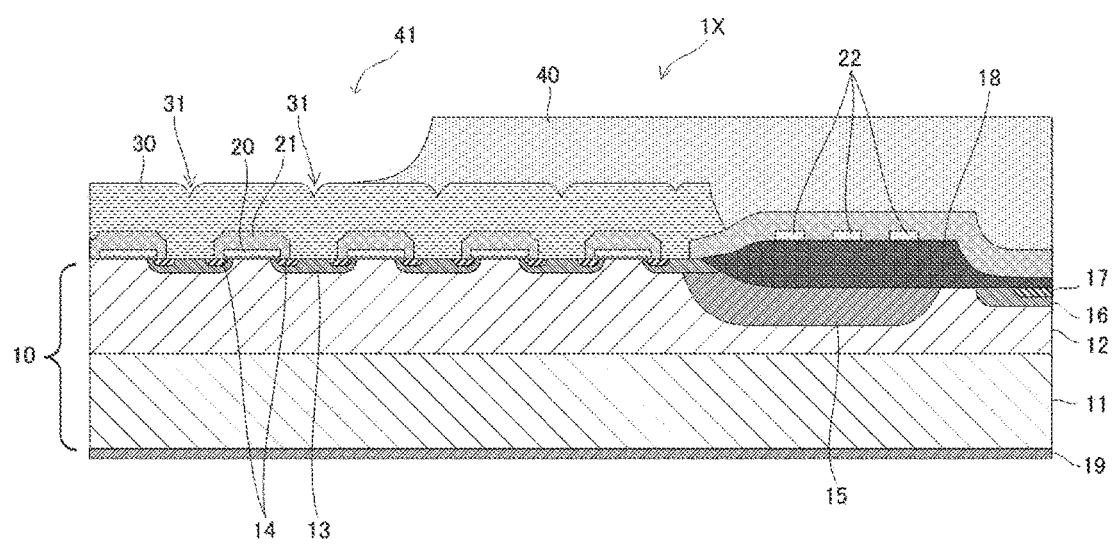
FIG. 1B is a cross-sectional view taken along the line 1B-1B of FIG. 1A.

Before describing a semiconductor device according to an exemplary embodiment of the present disclosure, a semiconductor device according to a comparative example will be described. FIG. 1A is a plan view illustrating a configuration of a semiconductor device 1X according to a comparative example, and FIG. 1B is a cross-sectional view taken along the line 1B-1B of FIG. 1A.

The semiconductor device 1X according to the comparative example configures a power MOSFET as an example. The semiconductor device 1X includes, for example, a semiconductor substrate 10 on which a substrate layer 11 configured by n-type silicon and an epitaxial layer 12 configured by n-type silicon having a lower impurity concentration than the impurity concentration of the substrate layer 11 are stacked. Plural base regions 13 having p-type conductivity are provided to a surface layer portion of the epitaxial layer 12, with fixed spacing between the base regions 13.

Plural gates 20 configured by polysilicon are provided to the surface of the epitaxial layer 12, with a gate insulating film interposed between the gates 20 and the front face of the epitaxial layer 12. Each of the plural gates 20 is provided bridging adjacent base regions 13. As illustrated in FIG. 1A, each of the plural gates 20 is disposed so as to extend in a straight line on the front face of the semiconductor substrate 10, and so as to be parallel to one another. An upper face and side faces of each gate 20 are covered by an insulating film 21 configured by an insulator such as phosphorus silicon glass (PSG). N-type source regions 14 inside each of the plural base regions 13 are provided to positions corresponding to end portions of the gate 20.

An outer peripheral portion of the semiconductor substrate 10 is provided with a field oxide film 18 configured by an insulator such as $SiO_2$. Guard rings 22 configured by polysilicon are provided to the front face of the field oxide film 18. The guard rings 22 form a pattern of rectangular loop shapes running along outer edges of the semiconductor substrate 10. The front face of the field oxide film 18 is covered by the insulating film 21, and the guard rings 22 are buried inside the insulating film 21. An outer peripheral portion of the epitaxial layer 12 is provided with a p-type diffusion region 15, an n-type diffusion region 16, and an n-type diffusion region 17. The p-type diffusion region 15 is for obtaining a desired withstand voltage. The n-type diffusion region 16 has a comparatively low impurity concentration. The n-type diffusion region 17 has a comparatively high impurity concentration and is provided within the diffusion region 16. The rear face of the semiconductor substrate 10 is provided with a rear face electrode 19 that configures a drain electrode.

The front face of the semiconductor substrate 10 is covered by a conductive film 30 that configures a source electrode. The conductive film 30 may be configured by stacked films that are plural metal films stacked together, and, as an example, may be configured by stacked films that are sequentially stacked Ti/TiN/Al-Si/Ti/TiN. Each gate 20 is buried within the conductive film 30, but is insulated from the conductive film 30 by the insulating film 21. Here, providing the plural gates 20 on the semiconductor substrate 10 produces undulations in the front face of the semiconductor substrate 10. As a result of the undulations produced on the front face of the semiconductor substrate 10, plural concave portions (grooves) 31 extending in a straight line along the extension direction of the plural gates 20 are formed in the front face of the conductive film 30. Note that, although the conductive film 30 is omitted from illustration in FIG. 1A, the concave portions 31 formed in the front face of the conductive film 30 are formed in positions corresponding to between mutually adjacent gates 20, and extend in a direction parallel to the extension direction of the gates 20.

The front face of the conductive film 30 is covered by a protecting film 40 configured by an insulator such as polyimide. The protecting film 40, for example, suppresses entry of moisture into the semiconductor device 1X, and soften impacts to the semiconductor device 1X. The protecting film 40 includes an opening 41 that partially exposes the conductive film 30 and also exposes the concave portions 31 formed in the front face of the conductive film 30. An electrical connection member such as a wire is connected to an exposed portion of the conductive film 30 exposed in the opening 41.

In FIG. 1A, the opening end 41E of the protecting film 40 is indicated by a dashed line, and the conductive film 30 is exposed at the inside of the opening end 41E. In the semiconductor device 1X according to the comparative example, as illustrated in FIG. 1A, the shape of the opening 41 of the protecting film 40 is a square or rectangle that has edges parallel to the extension direction of the gates 20 (namely, the extension direction of the concave portions 31 formed in the front face of the conductive film 30).

A method for forming the protecting film 40 will be described below. FIG. 2A to FIG. 2E are cross-sectional views illustrating an example of a formation process for the protecting film 40.

Figure 2A:
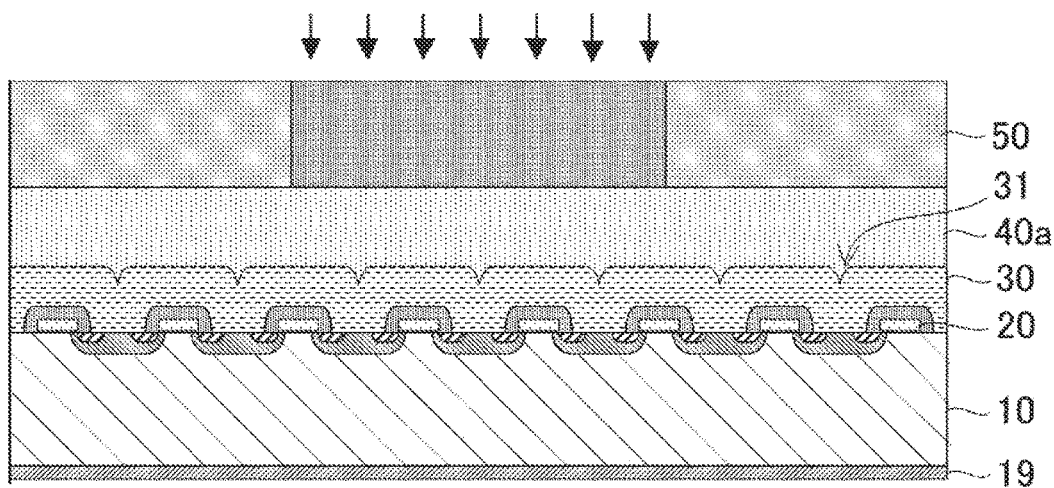
FIG. 2A to FIG. 2E are cross-sectional views illustrating formation processes of a protecting film.

After forming the conductive film 30 on the front face of the semiconductor substrate 10, a polyimide film 40a having a thickness of from approximately 1 μm to approximately 3 μm is formed on the front face of the conductive film 30 by using a spin coating method to apply a polyimide resin, which is the material of the protecting film 40, to the front face of the conductive film 30. Note that, in order to remove moisture on the semiconductor substrate 10 before applying the polyimide resin, the semiconductor substrate 10 may be subjected to heat treatment at a temperature of approximately 350° C. for approximately 30 minutes. After forming the polyimide film 40*a*, the polyimide film 40*a* is, for example, dried by heat treatment at 160° C. for 60 seconds. Next, a resist film 50 having a thickness of from approximately 1 µm to 3 µm is formed on the front face of the polyimide film 40*a*, and a portion of the resist film 50 corresponding to the formation position of the opening of the polyimide film 40*a* is exposed (FIG. 2A).

Figure 2B:
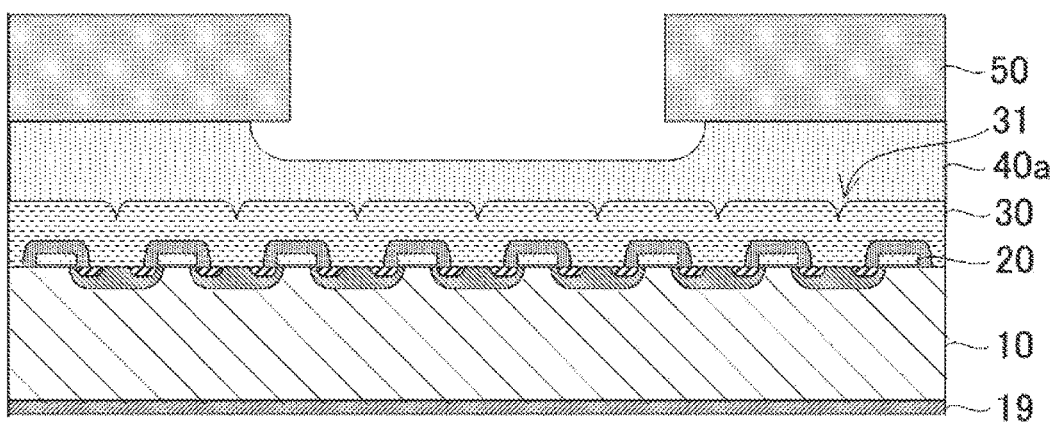

Next, the resist film 50 is developed using developer fluid. The polyimide film 40*a* dissolves in the developer fluid such that the polyimide film 40*a* is etched in the development processing of the resist film 50. The etching of the polyimide film 40*a* by the developer fluid is isotropic etching (FIG. 2B). The state illustrated in FIG. 2B is a half-etched state in which the etched portion of the polyimide film 40*a* does not reach to the conductive film 30.

Figure 2C:
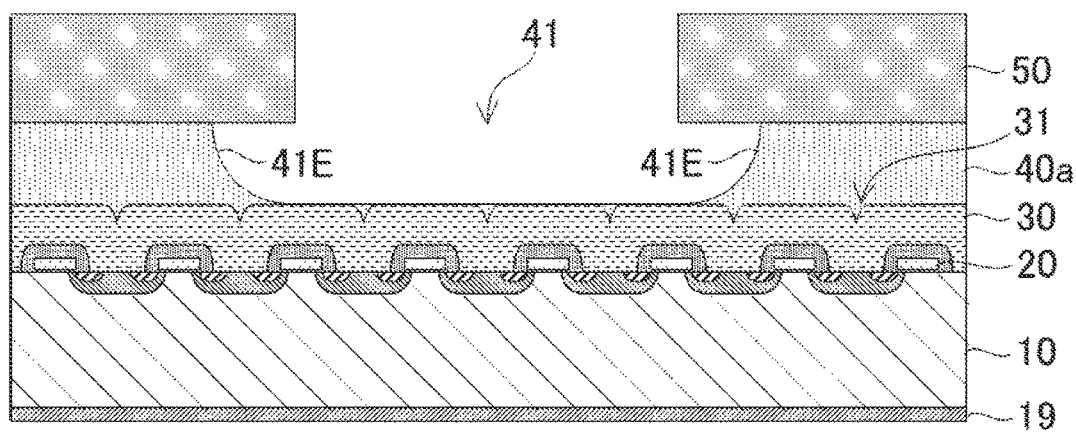

When etching of the polyimide film 40*a* by the developer fluid advances, an just-etched state is adopted in which the front face of the conductive film 30 is exposed in the opening 41 (FIG. 2C). In the just-etched state, the polyimide film 40*a* remains inside the concave portions 31 formed in the front face of the conductive film 30.

Figure 2D:
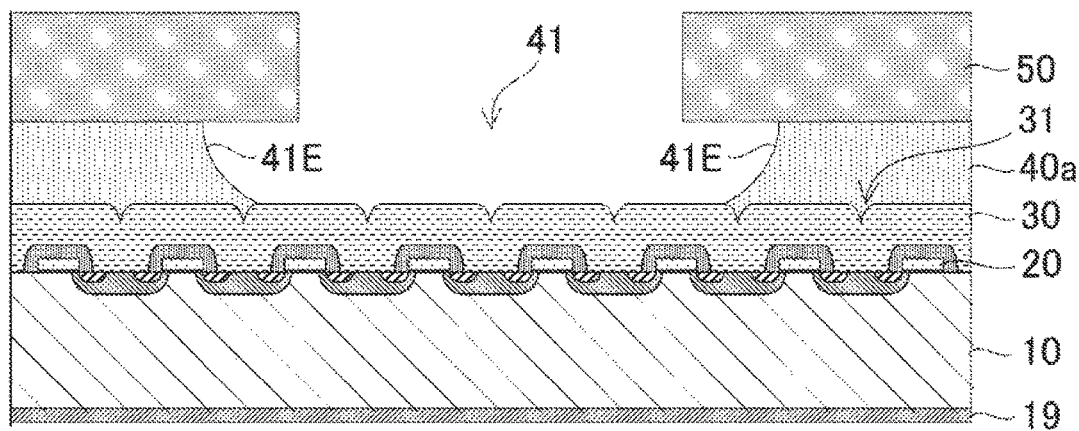

Over-etching by advancing the etching further than the just-etched state removes the polyimide film 40*a* remaining inside the concave portions 31 of the conductive film 30 (FIG. 2D). The duration for over-etching is, for example, determined in consideration of variation in the etching rate of the polyimide film 40*a* or the like. The opening end of the polyimide film 40*a* is moved further toward the outer side than in the just-etched state, since the etching of the polyimide film 40*a* advances isotropically.

Figure 2E:
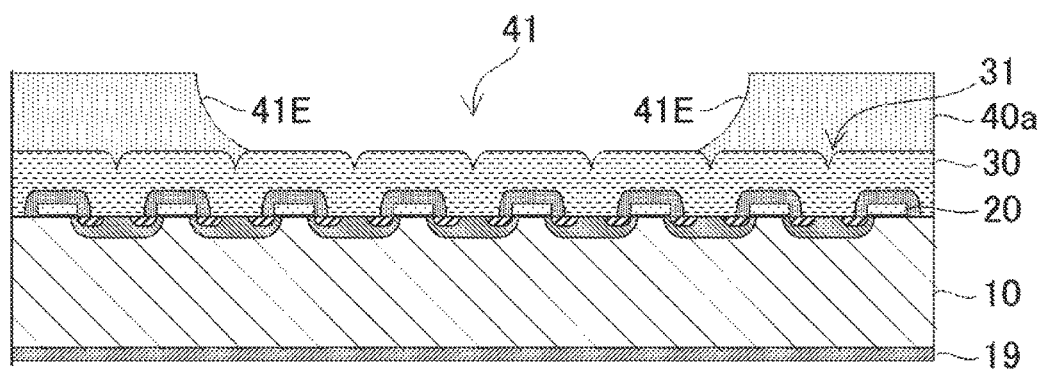

After over-etching of the polyimide film 40*a* is complete, the resist film 50 is removed using a stripper solution. Note that the polyimide film 40*a* does not dissolve in the stripper solution for removing the resist film 50. Subsequently, the polyimide film 40*a* is cured by heat treatment at approximately 165° C. for approximately 30 minutes (FIG. 2E). Formation of a protecting film 40 that includes the opening 41 is completed by the processes above.

Figure 3A:
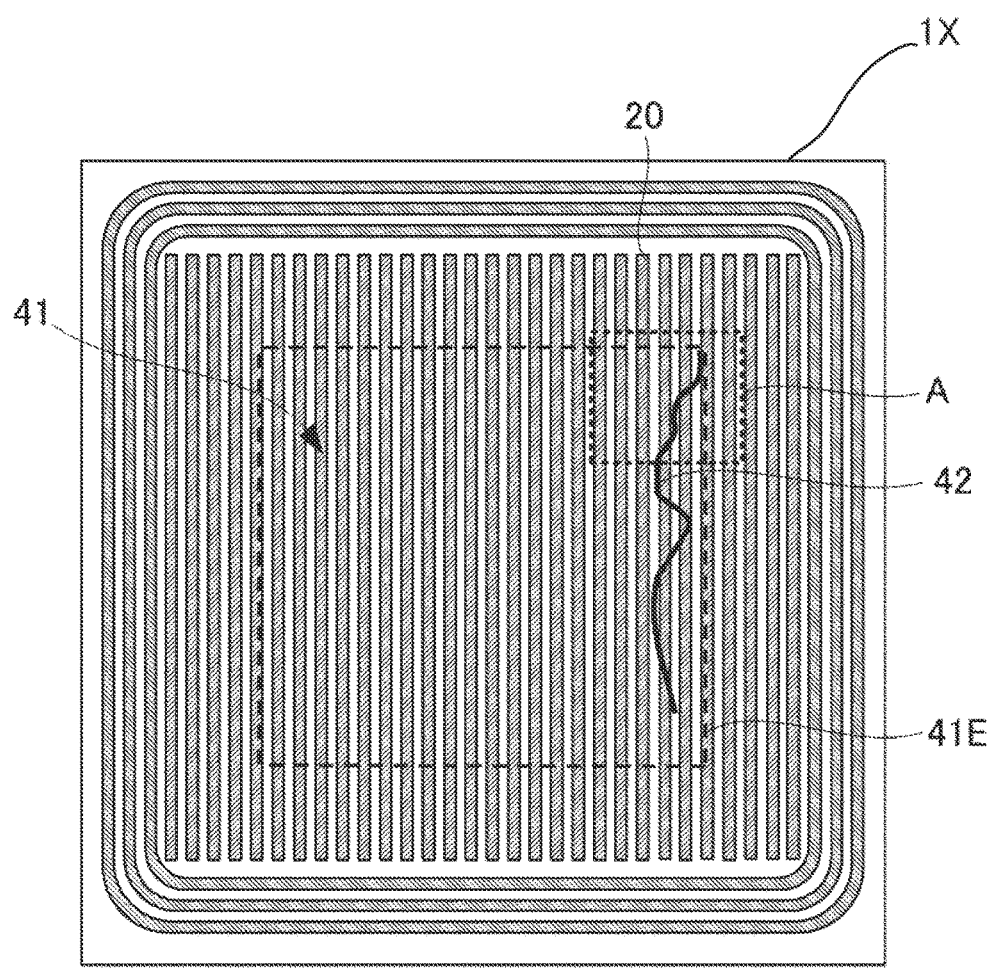
FIG. 3A is a plan view illustrating a state of a front face of a semiconductor device according to a comparative example when formation of a protecting film has completed.
Figure 3B:
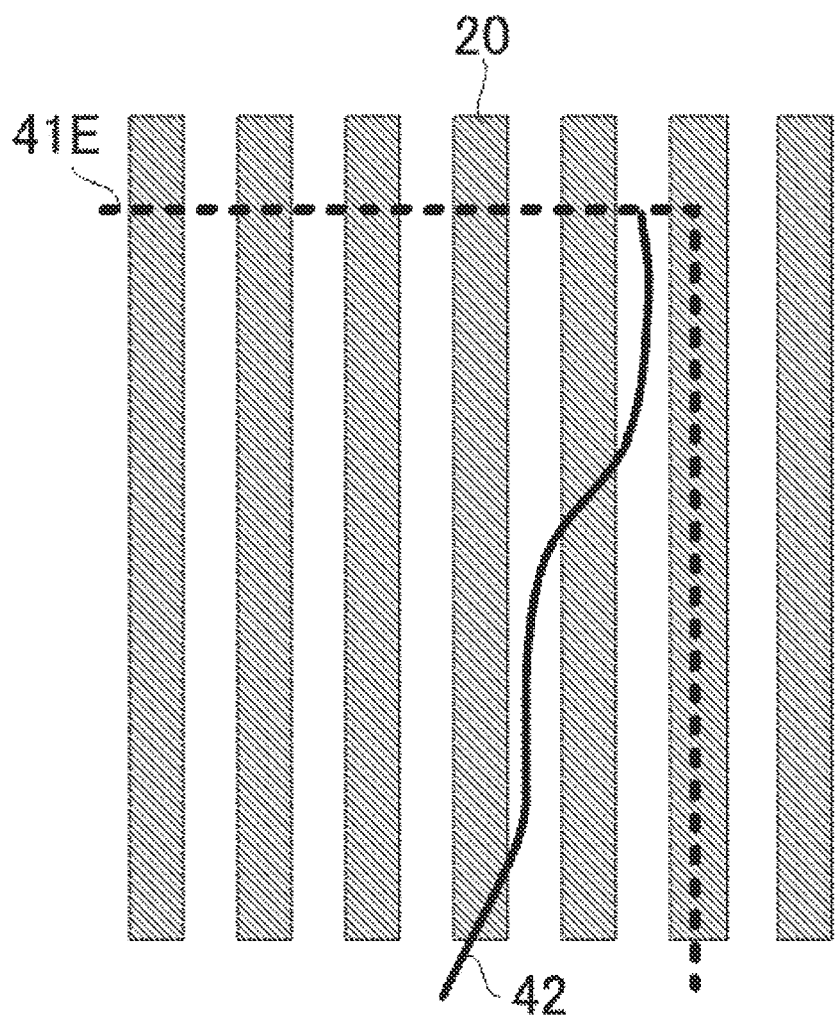
FIG. 3B is an enlarged view of a region A of FIG. 3A.

FIG. 3A is a plan view illustrating a state of the front face of the semiconductor device 1X according to a comparative example up until the process for curing the protecting film 40 is completed, and FIG. 3B is an enlarged viewed of a region A in FIG. 3A. In the semiconductor device 1X according to the comparative example, in some cases, a string-like residue 42 of the protecting film 40 remains in the vicinity of an opening end demarcating the outer edge of the opening 41 of the protecting film 40 (indicated by a dashed line in FIG. 3A and FIG. 3B). If residue 42 of the protecting film 40 adheres to the front face of the conductive film 30 exposed in the opening 41 of the protecting film 40, deficiencies in the bonding of the wire for connection to the exposed portion of the conductive film 30 may occur. Further, an external connection terminal is formed on the front face of the conductive film 30 in some cases, and if residue 42 of the protecting film 40 adheres to the front face of the conductive film 30 exposed in the opening 41 of the protecting film 40, deficiencies may occur in the connection between the conductive film 30 and the external connection terminal.

Hereinafter, the mechanism by which the string-like residue 42 is produced in the semiconductor device 1X according to the comparative example after curing the protecting film 40, will be described below.

Figure 4A:
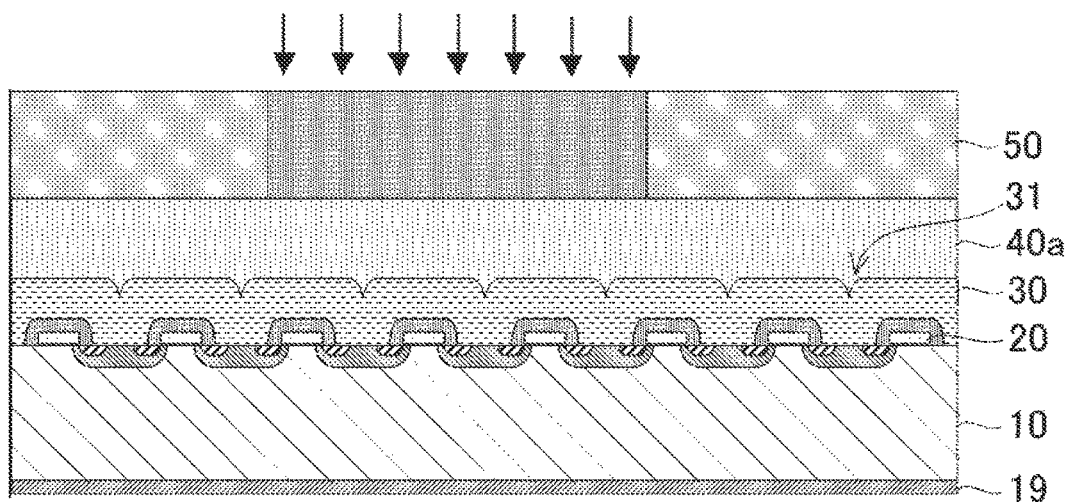
FIG. 4A to FIG. 4E are cross-sectional views illustrating formation processes of a protecting film.
Figure 4B:
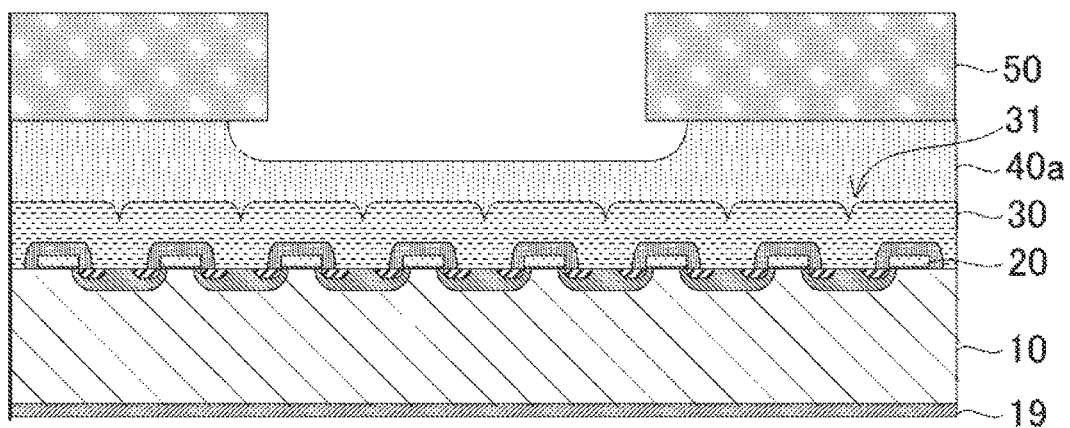
Figure 4C:
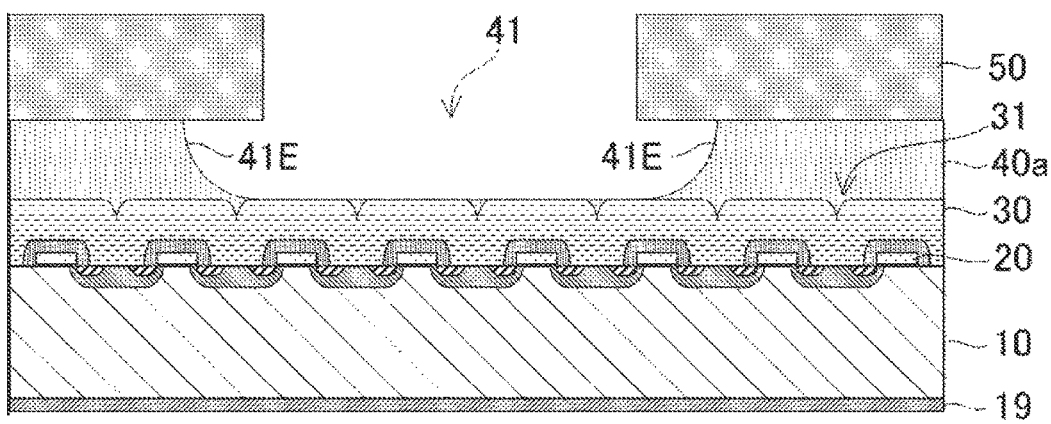
Figure 4D:
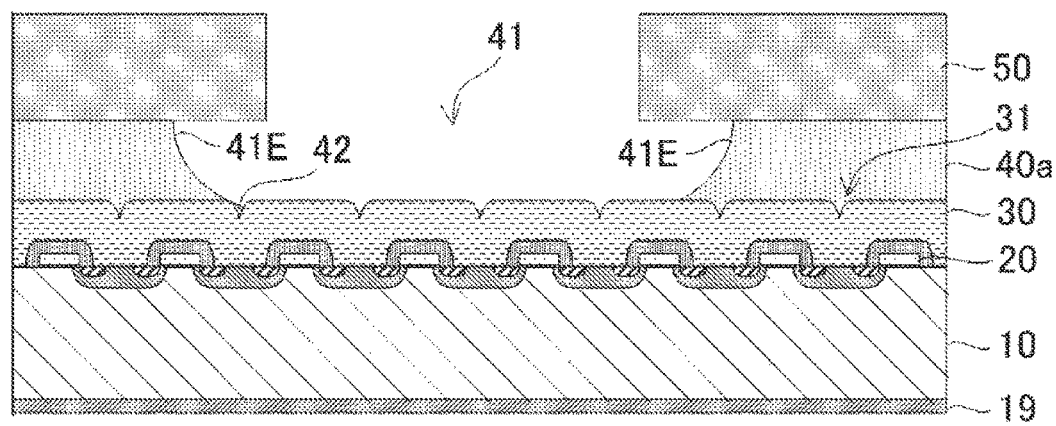
Figure 4E:
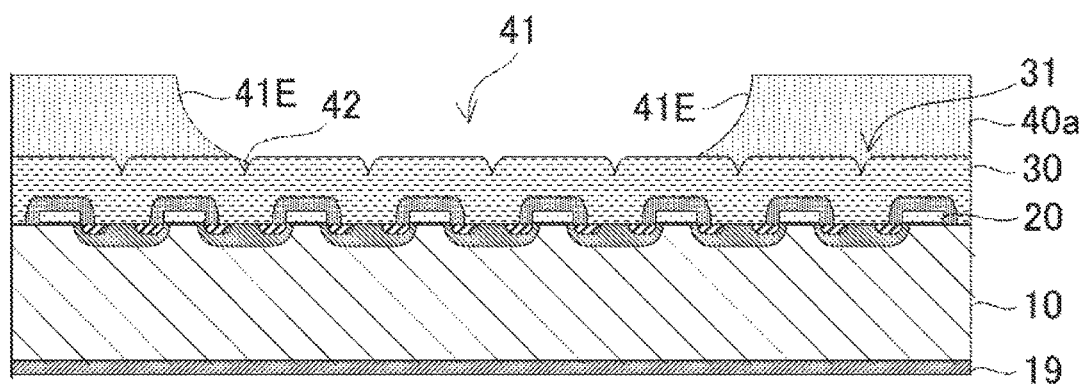

The string-like residue 42 is, for example, liable to be produced when the exposed region of the resist film 50 has been shifted from the region actually intended to be exposed as a result of, for example, misalignment of the photomask employed when partially exposing the resist film 50. FIG. 4A to FIG. 4E are cross-sectional views corresponding to FIG. 2A to FIG. 2E, respectively, illustrating a formation process for the protecting film 40 when the exposure region of the resist film 50 has been shifted from the region actually intended to be exposed. Namely, FIG. 4A illustrates a process in which the resist film 50 is partially exposed, and FIG. 4B illustrates a process in which the resist film 50 is developed and the polyimide film 40*a* is half-etched. FIG. 4C illustrates a process in which the polyimide film 40*a* is just-etched, and FIG. 4D illustrates a process in which the polyimide film 40*a* is over-etched. FIG. 4E illustrates a process in which the resist film 50 is removed and the polyimide film 40*a* is thermally cured.

Figure 5A:
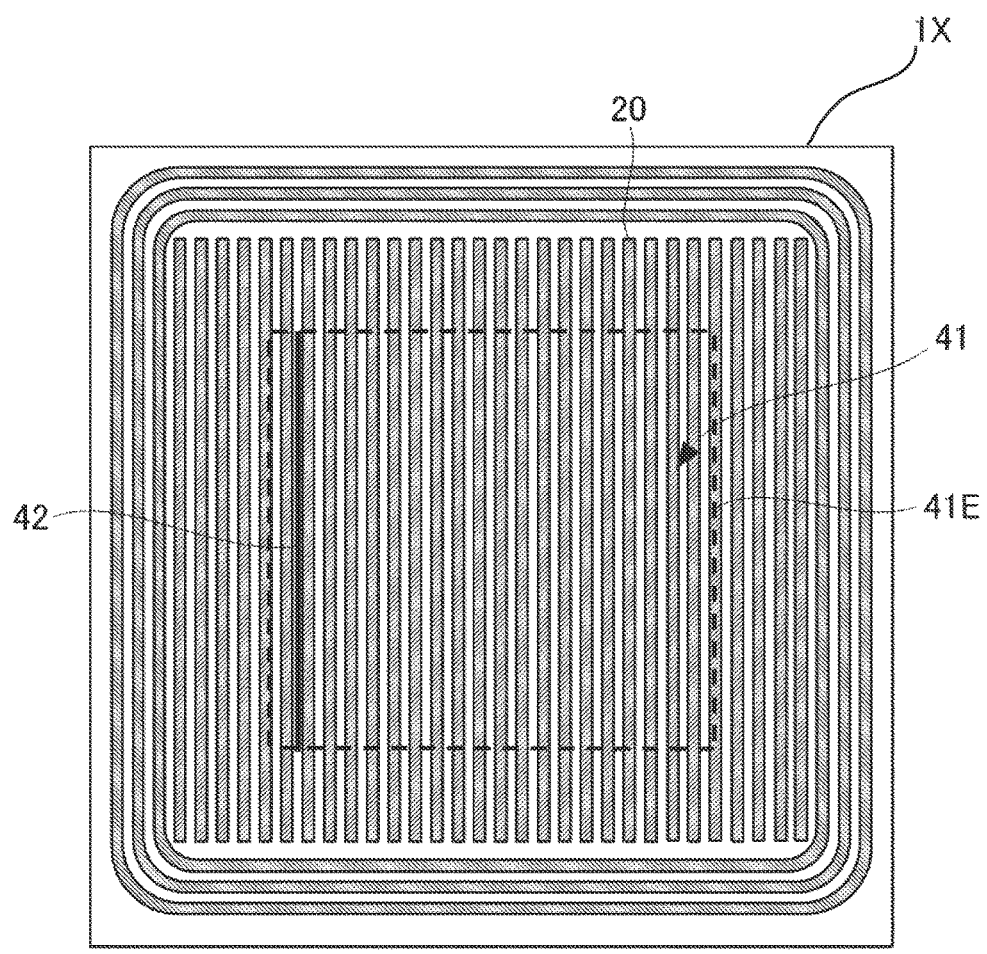
FIG. 5A is a plan view of a semiconductor device according to a comparative example after over-etching a polyimide film.

In the process in which the resist film 50 illustrated in FIG. 4A is partially exposed, in cases in which the exposed region of the resist film 50 has shifted from the region actually intended to be exposed in a direction intersecting the extension direction of the concave portions 31 of the conductive film 30, as a result of non-alignment of the photomask, for example, a base portion of the opening end 41E of the polyimide film 40*a* (the protecting film 40) may near a concave portion 31 formed in the front face of the conductive film 30 in the process in which the polyimide film 40*a* illustrated in FIG. 4D is over-etched. Since the etching of the polyimide film 40*a* advances isotropically, the polyimide film 40*a* remains as-is as residue 42 inside the concave portion 31 of the conductive film 30 near to the base portion of the opening end 41E of the polyimide film 40*a* (the protecting film 40), irrespective of whether there has been sufficient over-etching of the polyimide film 40*a* that entered into the concave portions 31 of the conductive film 30. FIG. 5A is a plan view of the semiconductor device 1X according to the comparative example, corresponding FIG. 4A.

Figure 5B:
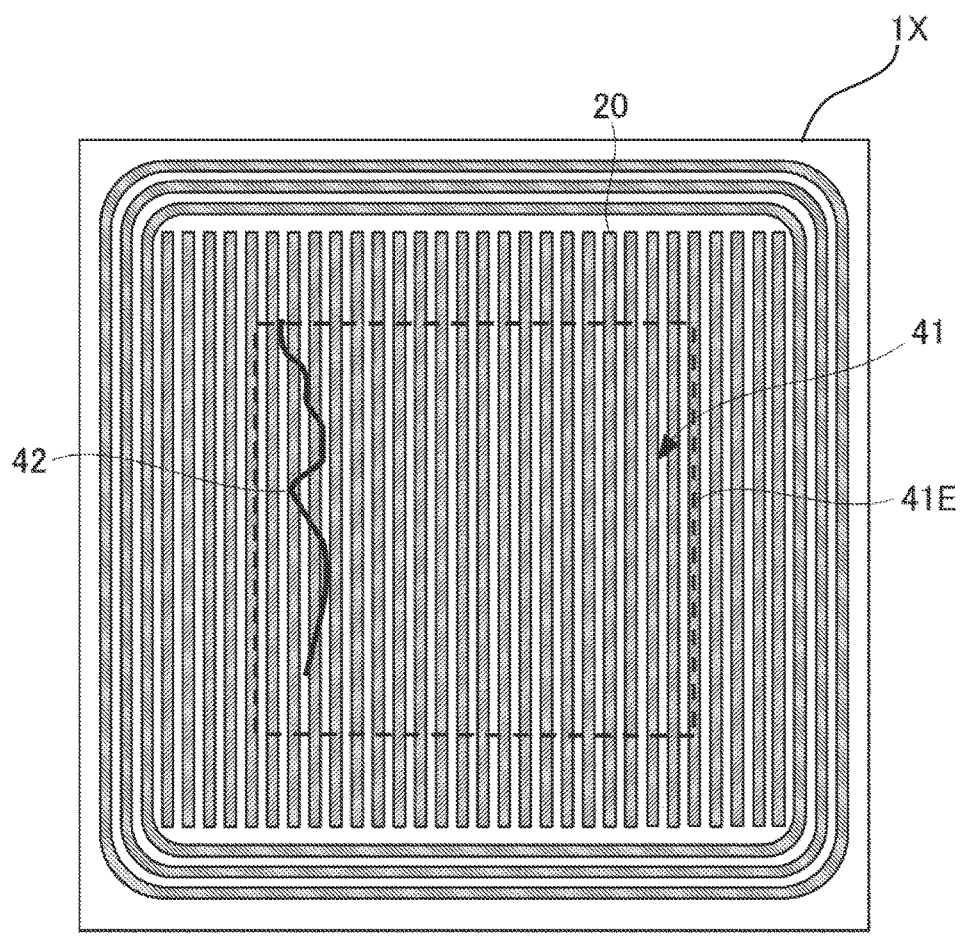
FIG. 5B is a plan view of a semiconductor device after a thermal curing process on a polyimide film.

In the process in which the polyimide film 40*a* illustrated in FIG. 4E is thermally cured, if the residue 42 of the polyimide film 40*a* remaining inside the concave portion 31 of the conductive film 30 thermally contracts, the residue 42 inside the concave portion 31 of the conductive film 30 separates from the inside of the concave portion 31 and remains on the front face of the conductive film 30 as string-like residue 42. FIG. 5B is a plan view of the semiconductor device 1X according to the comparative example, corresponding to FIG. 4E.

Note that, in the above description, although an example was given in which the cause of string-like residue 42 production was shifting of the exposed region of the resist film 50 as a result of, for example, misalignment of a photomask, there is no limitation thereto. For example, string-like residue 42 may also be produced when the position of the opening end 41E of the polyimide film 40*a* is not aligned with the intended position after over-etching due to the position of the opening end 41E of the polyimide film 40*a* not being aligned with the intended position by expansion or shrinkage of the exposed region of the resist film 50. Further, fluctuations in the etching rate of the developer fluid on the polyimide film 40*a* may cause string-like residue 42 to also be produced in cases in which the position of the opening end 41E of the polyimide film 40*a* is not aligned with the intended position after over-etching.

A semiconductor device according to an exemplary embodiment of the present disclosure will be described below, with reference to the drawings. Note that in each of the drawings, configuration elements and sections equivalent or corresponding to those of the semiconductor device 1X according to the comparative example described above are allocated the same reference numerals and redundant explanation thereof is omitted.

First Exemplary Embodiment

Figure 6A:
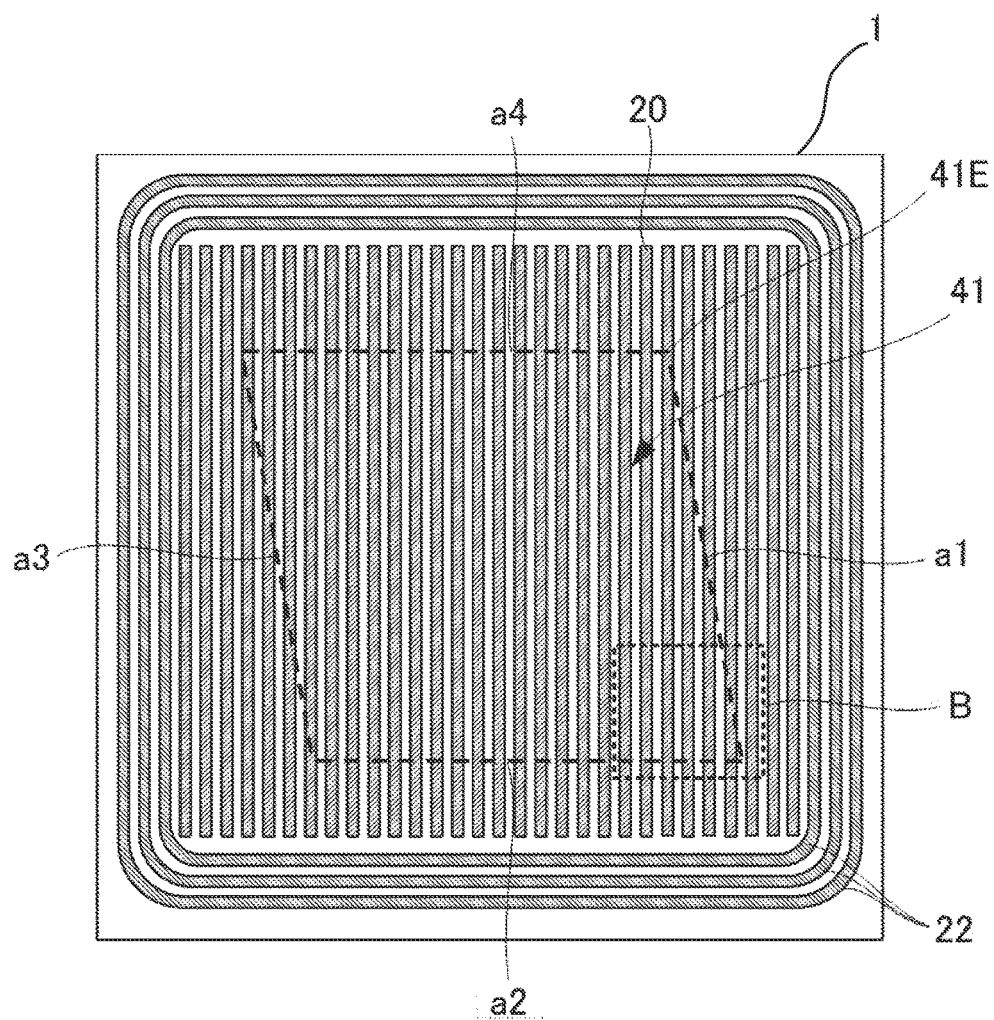
FIG. 6A is a plan view illustrating a configuration of a semiconductor device according to an exemplary embodiment of the present disclosure.
Figure 6B:
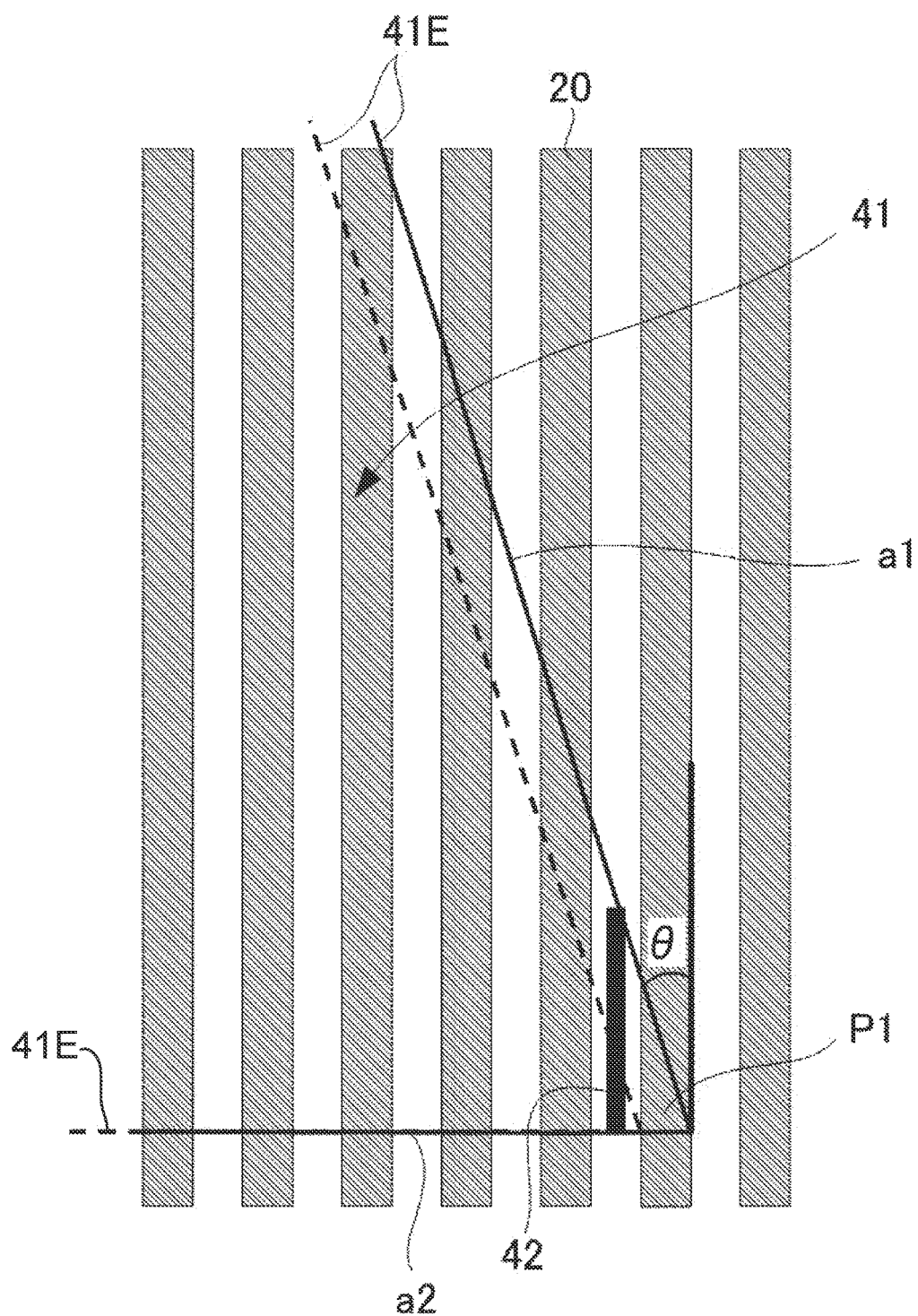
FIG. 6B is an enlarged view of a region B enclosed by the dashed line in FIG. 6A.

FIG. 6A is a plan view illustrating a configuration of a semiconductor device 1 according to a first exemplary embodiment of the present disclosure, and FIG. 6B is an enlarged view of a region B enclosed by the dashed line in FIG. 6A. In the semiconductor device 1, the shape of the opening 41 of the protecting film 40 differs from that in the semiconductor device 1X according to the comparative example. The configuration of the semiconductor device 1 is otherwise the same as that of the semiconductor device 1X according to the comparative example. Namely, the semiconductor device 1 configures a power MOSFET as an example, and the cross-sectional view structure thereof is the same as that of the semiconductor device 1X according to the comparative example illustrated in FIG. 1B. Further, in the semiconductor device 1, the method of forming the protecting film 40 is the same as in the semiconductor device 1X according to the comparative example. The method includes a process of forming the resist film 50 on the front face of the polyimide film 40a and partially exposing the resist film 50 (see FIG. 2A), a process of developing the resist film 50 and half-etching the polyimide film 40a (see FIG. 2B), a process of just-etching the polyimide film 40a (see FIG. 2C), a process of over-etching the polyimide film 40a (see FIG. 2D), and a process of removing the resist film 50 and thermally curing the polyimide film 40a (see FIG. 2E). Note that although the conductive film 30 is omitted from illustration in FIG. 6A and FIG. 6B, the conductive film 30 is formed on the front face of the semiconductor substrate 10 so as to cover the gates 20. Further, the concave portions 31 formed in the front face of the conductive film 30 are formed in positions corresponding to between mutually adjacent gates 20, and extend in a direction parallel to the extension direction of the gates 20. Further, with regard to the protecting film 40, although only the opening end 41E is illustrated in FIG. 6A and FIG. 6B, this being the outer edge of the opening 41, the protecting film 40 covers the front face of the conductive film 30 such that the conductive film 30 is partially exposed in the opening 41, similarly to in the semiconductor device 1X according to the comparative example.

In the semiconductor device 1, the shape of the opening 41 of the protecting film 40 (the polyimide film 40a) is a quadrilateral having an edge a1 and an edge a3 that are inclined in an oblique direction with respect to the extension direction of the concave portions 31 of the conductive film 30 (namely, the extension direction of the gates 20), and an edge a2 and an edge a4 that are perpendicular to the extension direction of the concave portions 31 of the conductive film 30. Namely, the opening end 41E of the protecting film 40 (the polyimide film 40a) is configured by edges a1 to a4. An angle θ formed between the extension direction of the concave portions 31 of the conductive film 30 (namely, the extension direction of the gates 20) and the edge a1 satisfies 0°<θ<90°. The same applies to the angle formed between the extension direction of the concave portions 31 and the edge a3, and the edge a1 and the edge a3 may be parallel to each other. Thus, in the semiconductor device 1, the opening 41 of the protecting film 40 (the polyimide film 40a) has no edges parallel to the extension direction of the concave portions 31 of the conductive film 30 (namely, the extension direction of the gates 20).

In FIG. 6B, the correct position of the opening end 41E of the protecting film 40 (the polyimide film 40a) is indicated by the dashed line, and the position of the opening end 41E of the protecting film 40 (the polyimide film 40a) when not aligned with the correct position is indicated by the solid line. As illustrated in FIG. 6B, in the semiconductor device 1, in cases in which the position of the opening end 41E of the protecting film 40 (the polyimide film 40a) is not aligned with the correct position, residue 42 of the protecting film 40 (the polyimide film 40a) may be produced in the vicinity of an angle portion P1 where the edge a1 of the opening 41, which is inclined in an oblique direction with respect to the extension direction of the concave portions 31 of the conductive film 30 (namely, the extension direction of the gates 20), intersects with the edge a2 of the opening 41, which is perpendicular to the extension direction of the concave portions 31 of the conductive film 30. Similarly, residue 42 of the protecting film 40 may also be produced in the vicinity of an angle portion where the edge a3 and the edge a4 of the opening 41 intersect.

However, since the edge a1 and the edge a3 are inclined in an oblique direction with respect to the extension direction of the concave portions 31 of the conductive film 30 (namely, the extension direction of the gates 20), the concave portions 31 of the conductive film 30 are interrupted by the edge a1 and the edge a3 such that the length of residue 42 produced in any location would be shorter than the length of residue 42 produced in the semiconductor device 1X according to the comparative example. The length of residue 42 is accordingly shortened, such that the amount of contraction by the residue 42 during thermal curing of the protecting film 40 (the polyimide film 40a) is lessened. Further, in the semiconductor device 1 according to the present exemplary embodiment, both ends of the residue 42 are connected to the protecting film (the polyimide film 40a) at outer side of the opening 41. Accordingly, risk of residue 42 separating from the concave portions (grooves) 31 of the conductive film 30 and becoming string-like is lowered. As long as residue 42 remains inside the concave portions 31 of the conductive film 30, issues such as the wire bonding deficiency described above will not occur. Furthermore, the edge a1 and the edge a3 are inclined in an oblique direction with respect to the extension direction of the concave portions 31 of the conductive film 30 (namely, the extension direction of the gates 20), such that developer fluid can easily enter from both sides of the concave portions 31 of the conductive film 30 disposed in the vicinity of the angle portion P1 and removal of the residue 42 may be promoted.

Second Exemplary Embodiment

Figure 7A:
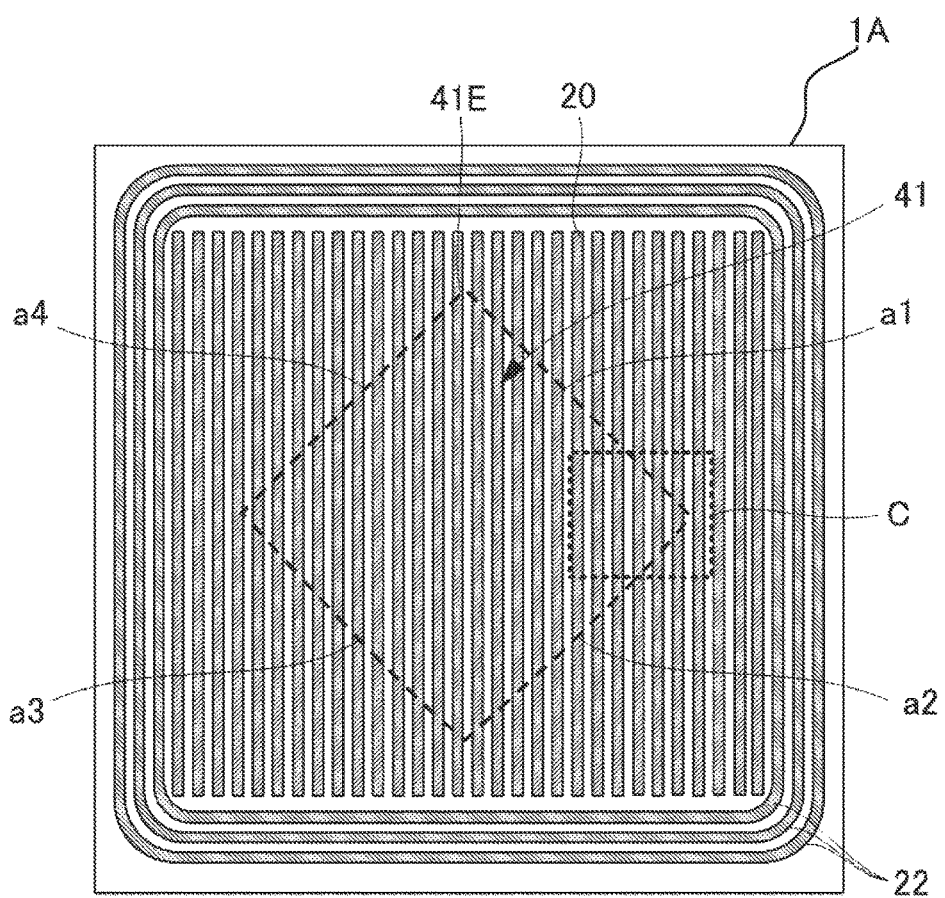
FIG. 7A is a plan view illustrating a configuration of a semiconductor device according to another exemplary embodiment of the present disclosure.
Figure 7B:
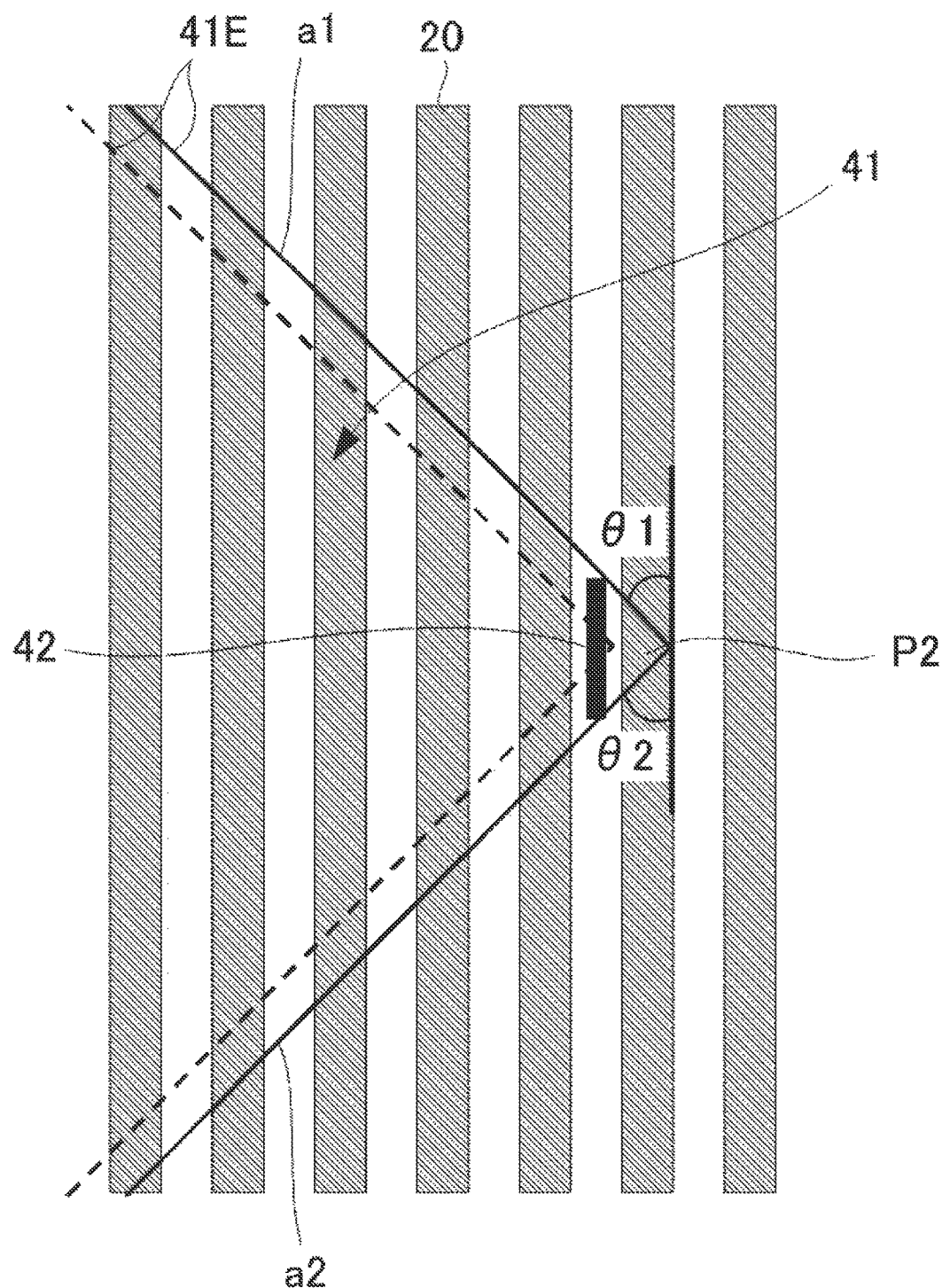
FIG. 7B is an enlarged view of a region C enclosed by the dashed line in FIG. 7A.

FIG. 7A is a plan view illustrating a configuration of a semiconductor device 1A according to a second exemplary embodiment of the present disclosure, and FIG. 7B is an enlarged view of a region C enclosed by the dashed line in FIG. 7A. In the semiconductor device 1A, the shape of the opening 41 of the protecting film 40 differs from that in the semiconductor device 1X according to the comparative example and the semiconductor device 1 according to the first exemplary embodiment. The configuration of the semiconductor device 1A is otherwise the same as that of the semiconductor device 1X according to the comparative example and the semiconductor device 1 according to the first exemplary embodiment. Further, in the semiconductor device 1A, the method of forming protecting film 40 is the same as that of the semiconductor device 1X according to the comparative example and the semiconductor device 1 according to the first exemplary embodiment described above. Note that although the conductive film 30 is omitted from illustration in FIG. 7A and FIG. 7B, the conductive film 30 is formed on the front face of the semiconductor substrate 10 so as to cover the gates 20. Further, the concave portions 31 formed in the front face of the conductive film 30 are formed in positions corresponding to between mutually adjacent gates 20, and extend in a direction parallel to the extension direction of the gates 20. Further, with regard to the protecting film 40, although only the opening end 41E, this being the outer edge of the opening 41, is illustrated in FIG. 7A and FIG. 7B, the protecting film 40 covers the front face of the conductive film 30 such that the conductive film 30 is partially exposed in the opening 41, similarly to in the semiconductor device 1X according to the comparative example.

In the semiconductor device 1A, the shape of the opening 41 of the protecting film 40 (the polyimide film 40a) is a quadrilateral having edges a1, a2, a3, and a4 that are inclined in an oblique direction with respect to the extension direction of the concave portions 31 of the conductive film 30 (namely, the extension direction of the gates 20). Namely, the opening end 41E of the protecting film 40 (the polyimide film 40a) is configured by edge a1 to edge a4. An angle θ1 formed between the extension direction of the concave portions 31 of the conductive film 30 (namely, the extension direction of the gates 20) and the edge a1, and an angle θ2 formed between the extension direction of the concave portions 31 and the edge a2 satisfy 0°<θ1<90° and 0°<θ2<90°, respectively. The same applies to angles formed between the extension direction of the concave portions 31, and the edge a3 and the edge a4. Note that θ1 may be equal to θ2. Further, the edge a1 and the edge a3 may be parallel to each other and the edge a2, and the edge a4 may be parallel to each other. Thus, in the semiconductor device 1A, the opening 41 of the protecting film 40 (the polyimide film 40a) has no edges parallel to the extension direction of the concave portions 31 of the conductive film 30 (namely, the extension direction of the gates 20).

In FIG. 7B, the correct position of the opening end 41E of the protecting film 40 (the polyimide film 40a) is indicated by the dashed line, and the position of the opening end 41E of the protecting film 40 (the polyimide film 40a) when not aligned with the correct position is indicated by the solid line. As illustrated in FIG. 7B, in the semiconductor device 1A, in cases in which the position of the opening end 41E of the protecting film 40 (the polyimide film 40a) is not aligned with the correct position, residue 42 of the protecting film 40 (the polyimide film 40a) may be produced in the vicinity of an angle portion P2 where the edge a1 and the edge a2 intersect. Similarly, residue 42 may also be produced in the vicinity of the angle portion where the edge a3 and the edge a4 intersect.

However, the edge a1 to the edge a4 of the opening 41 are each inclined in an oblique direction with respect to the extension direction of the concave portions 31 of the conductive film 30 (namely, the extension direction of the gates 20), such that the concave portions 31 of the conductive film 30 are interrupted by the edge a1 to the edge a4 and the length of residue 42 produced at any location will be shorter than the length of residue 42 produced in the semiconductor device 1X according to the comparative example. The length of residue 42 is accordingly shortened, such that the amount of contraction by the residue 42 during thermal curing of the protecting film 40 (the polyimide film 40a) is lessened. Further, in the semiconductor device 1A according to the present exemplary embodiment, both ends of the residue 42 are connected to the protecting film (the polyimide film 40a) at the outer side of the opening 41. Accordingly, the risk of residue 42 separating from the concave portions 31 of the conductive film 30 and becoming string-like is lowered. As long as residue 42 remains inside the concave portions 31 of the conductive film 30, issues such as the wire bonding deficiency described above will not occur. Furthermore, the edge a1 to the edge a4 are inclined in an oblique direction with respect to the extension direction of the concave portions 31 of the conductive film 30 (namely, the extension direction of the gates 20), such that developer fluid can easily enter from both sides of the concave portions 31 of the conductive film 30 disposed in the vicinity of the angle portion P2 and removal of the residue 42 may be promoted.

Third Exemplary Embodiment

Figure 8A:
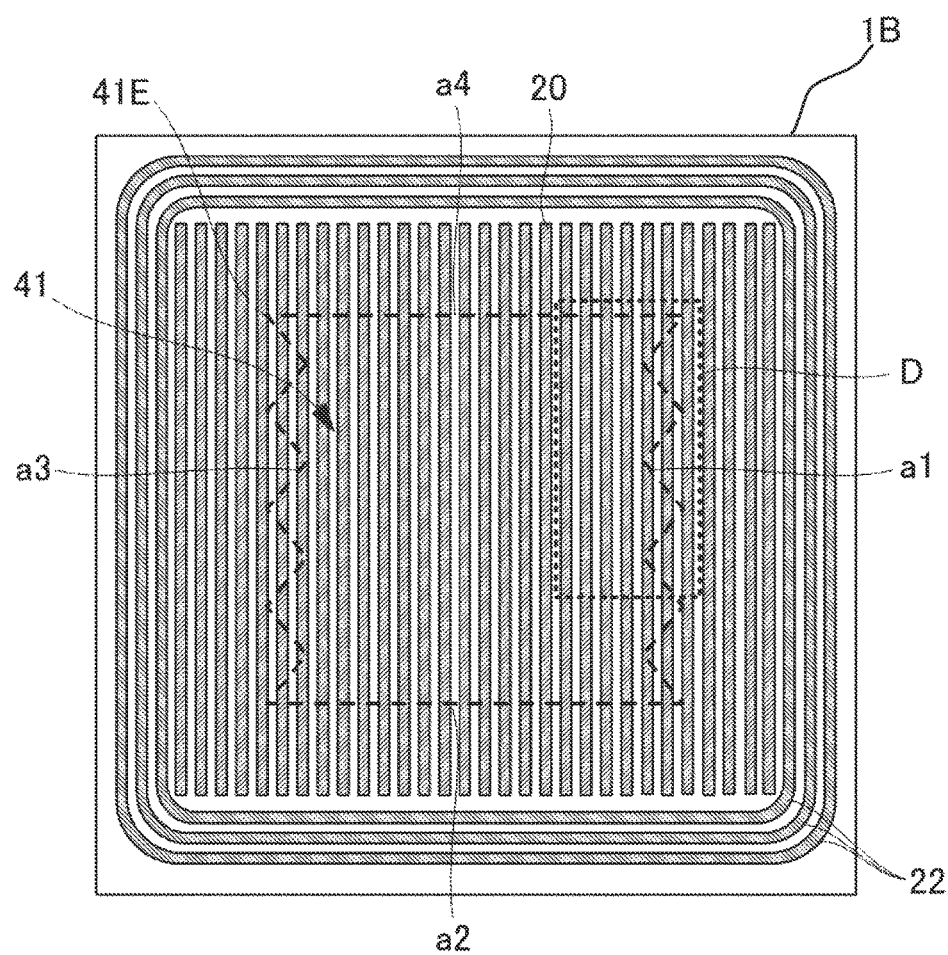
FIG. 8A is a plan view illustrating a configuration of a semiconductor device according to another exemplary embodiment of the present disclosure.
Figure 8B:
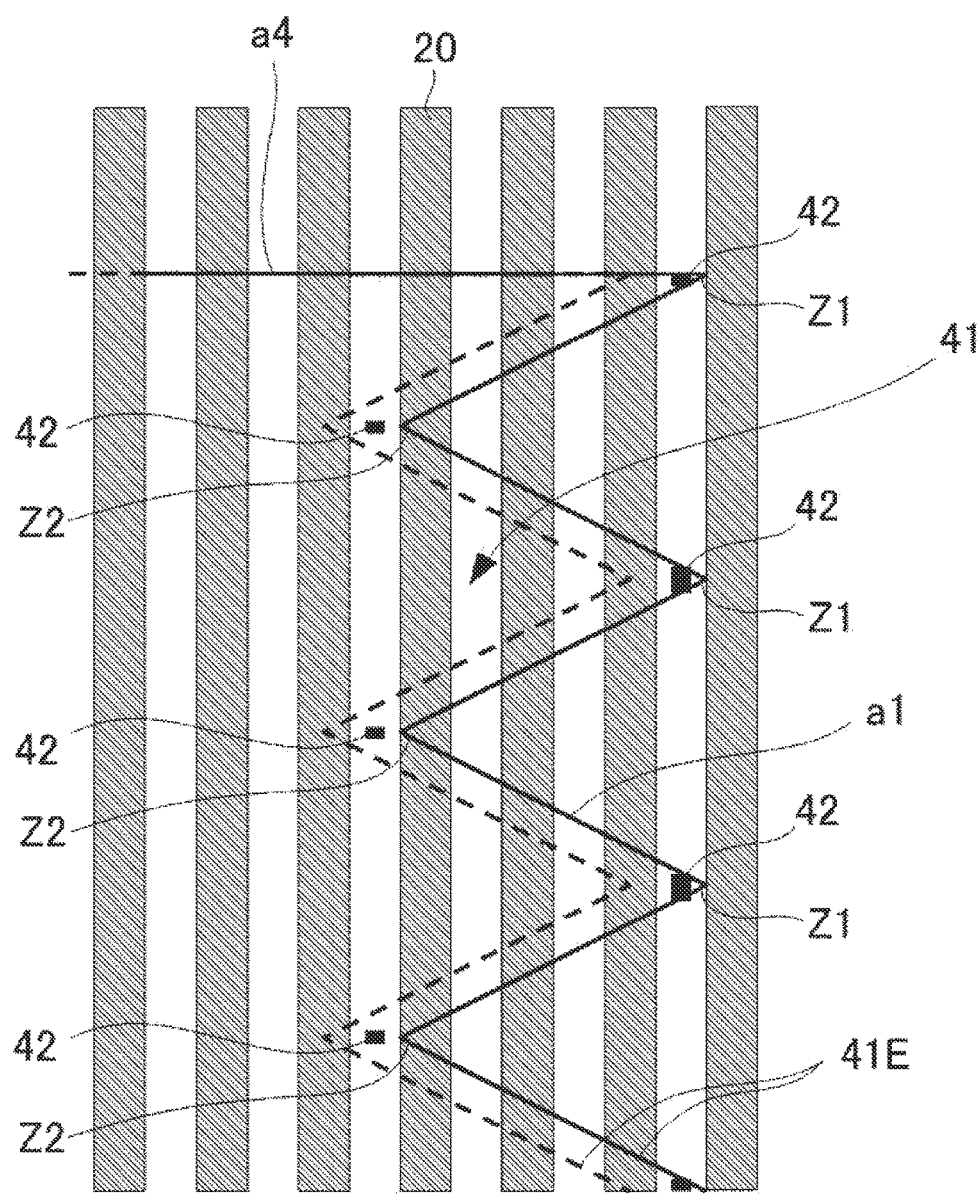
FIG. 8B is an enlarged view of a region D enclosed by the dashed line in FIG. 8A.

FIG. 8A is a plan view illustrating a configuration of a semiconductor device 1B according to a third exemplary embodiment of the present disclosure, and FIG. 8B is an enlarged view of a region D enclosed by the dashed line in FIG. 8A. In the semiconductor device 1B, the shape of the opening 41 of the protecting film 40 differs from the semiconductor device 1X according to the comparative example and the semiconductor device 1 according to the first exemplary embodiment. The configuration of the semiconductor device 1B is otherwise the same as that of the semiconductor device 1X according to the comparative example and the semiconductor device 1 according to the first exemplary embodiment. Further, in the semiconductor device 1B, the method of forming the protecting film 40 is the same as in the semiconductor device 1X according to the comparative example and the semiconductor device 1 according to the first exemplary embodiment described above. Note that although the conductive film 30 is omitted from illustration in FIG. 8A and FIG. 8B, the conductive film 30 is formed on the front face of the semiconductor substrate 10 so as to cover the gates 20. Further, the concave portions 31 of the conductive film 30 are formed in positions corresponding to between mutually adjacent gates 20, and extend in a direction parallel to the extension direction of the gates 20. Further, regarding the protecting film 40, although only the opening end 41E, this being the outer edge of the opening 41, is illustrated in FIG. 8A and FIG. 8B, the protecting film 40 covers the front face of the conductive film 30 such that the conductive film 30 is partially exposed in the opening 41, similarly to in the semiconductor device 1X according to the comparative example.

In the semiconductor device 1B, the opening 41 of the protecting film 40 (the polyimide film 40a) includes the edge a1 and the edge a3 that extend in the extension direction of the concave portions 31 of the conductive film 30 (namely, the extension direction of the gates 20) while meandering so as to repeatedly intersect at least one out of the concave portions 31 of the conductive film 30, and also includes the edge a2 and the edge a4 that are perpendicular to the extension direction of the concave portions 31 of the conductive film 30 (namely, the extension direction of the gates 20). Namely, the opening end 41E of the protecting film 40 (the polyimide film 40a) is configured by the edges a1 to a4. In the semiconductor device 1B, the meandering edge a1 and edge a3 of the opening 41 have zig-zag patterns that do not include portions parallel to the extension direction of the concave portions 31 of the conductive film 30 (namely, the extension direction of the gates 20). Each edge configuring the zig-zag pattern in the edge a1 and the edge a3 is inclined in an oblique direction with respect to the extension direction of the concave portions 31 of the conductive film 30 (namely, the extension direction of the gates 20).

In FIG. 8B, the correct position of the opening end 41E of the protecting film 40 (the polyimide film 40a) is indicated by the dashed line, and the position of the opening end 41E of the protecting film 40 (the polyimide film 40a) when not aligned with the correct position is indicated by the solid line. As illustrated in FIG. 8B, in the semiconductor device 1B, when the position of the opening end 41E of the protecting film 40 (the polyimide film 40a) is not aligned with the correct position, residue 42 of the protecting film 40 (the polyimide film 40a) may be produced in the vicinity of each outer-side bent portion Z1 and in the vicinity of each inner-side bent portion Z2 in the zig-zag pattern of the edge a1. Similarly, residue 42 of the protecting film 40 (the polyimide film 40a) may also be produced in the vicinity of each bent portion in the zig-zag pattern of the edge a3 that is opposite the edge a1.

However, the edge a1 and the edge a3 of the opening 41 have zig-zag patterns, such that the concave portions 31 of the conductive film 30 are interrupted by the zig-zag pattern and the length of residue 42 produced at any location will be shorter than the length of residue 42 produced in the semiconductor device 1X according to the comparative example. The length of residue 42 is thus shortened, such that the amount of contraction by the residue 42 during thermal curing of the protecting film 40 (the polyimide film 40a) is lessened. Further, in the semiconductor device 1B according to the present exemplary embodiment, both ends of the residue 42 are connected to the protecting film (the polyimide film 40a) at the outer side of the opening 41. Accordingly, the risk of residue 42 separating from the concave portions 31 of the conductive film 30 and becoming string-like is lowered. As long as residue 42 remains inside the concave portions 31 of the conductive film 30, issues such as the wire bonding deficiency described above will not occur.

Figure 9:
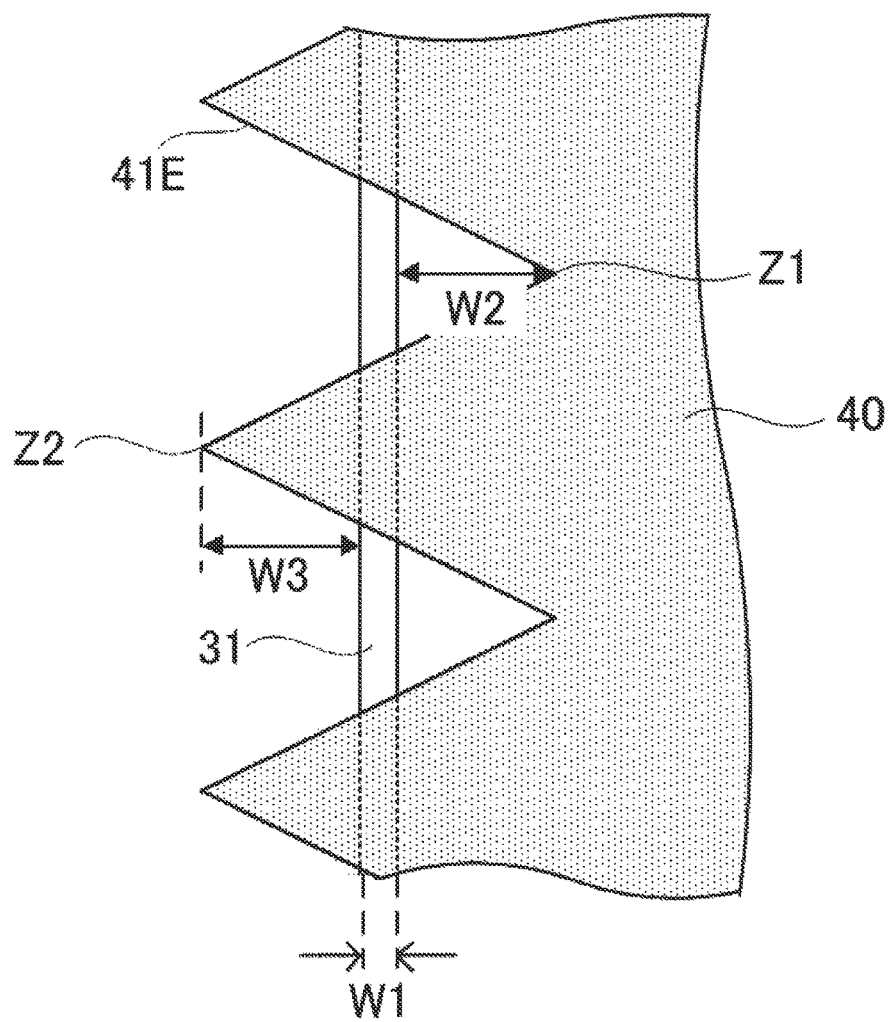
FIG. 9 is a plan view illustrating a relative positional relationship between a zig-zag pattern of an opening of a protecting film and concave portions formed in the front face of a conductive film according to an exemplary embodiment of the present disclosure.

FIG. 9 is a plan view illustrating relative positional relationships between the zig-zag pattern of the edge a1 of the opening 41 of the protecting film 40 and the concave portions 31 of the conductive film 30. A distance W2 between the outer-side bent portions Z1 and the concave portions 31 of the conductive film 30 in the zig-zag pattern of the edge a1 and a distance W3 between the inner-side bent portions Z2 and the concave portions 31 of the conductive film 30 in the zig-zag pattern of the edge a1 are each preferably no less than twice the width W1 of the concave portions 31 of the conductive film 30. Namely, 2W1<W2 and 2W1<W3 are preferably satisfied. The same applies for the relative positional relationship between the zig-zag pattern of the edge a3 and the concave portions 31 of the conductive film 30. Setting each of the distances W2 and W3 between each bent portion in the zig-zag patterns of the edge a1 and the edge a3 and the concave portions 31 of the conductive film 30 to no less than twice the width W1 of the concave portions 31 of the conductive film 30 makes it easy for developer fluid to enter from both sides of the concave portions 31 of the conductive film 30 disposed in the vicinity of the bent portions Z1 and Z2 of the zig-zag patterns and promotes removal of the residue 42.

Note that in the present exemplary embodiment, although an example has been given in which the edge a1 and the edge a3 of the opening of the protecting film 40 have zig-zag patterns that meander in straight lines, the edge a1 and the edge a3 may have patterns that meander in curved lines.

Fourth Exemplary Embodiment

Figure 10A:
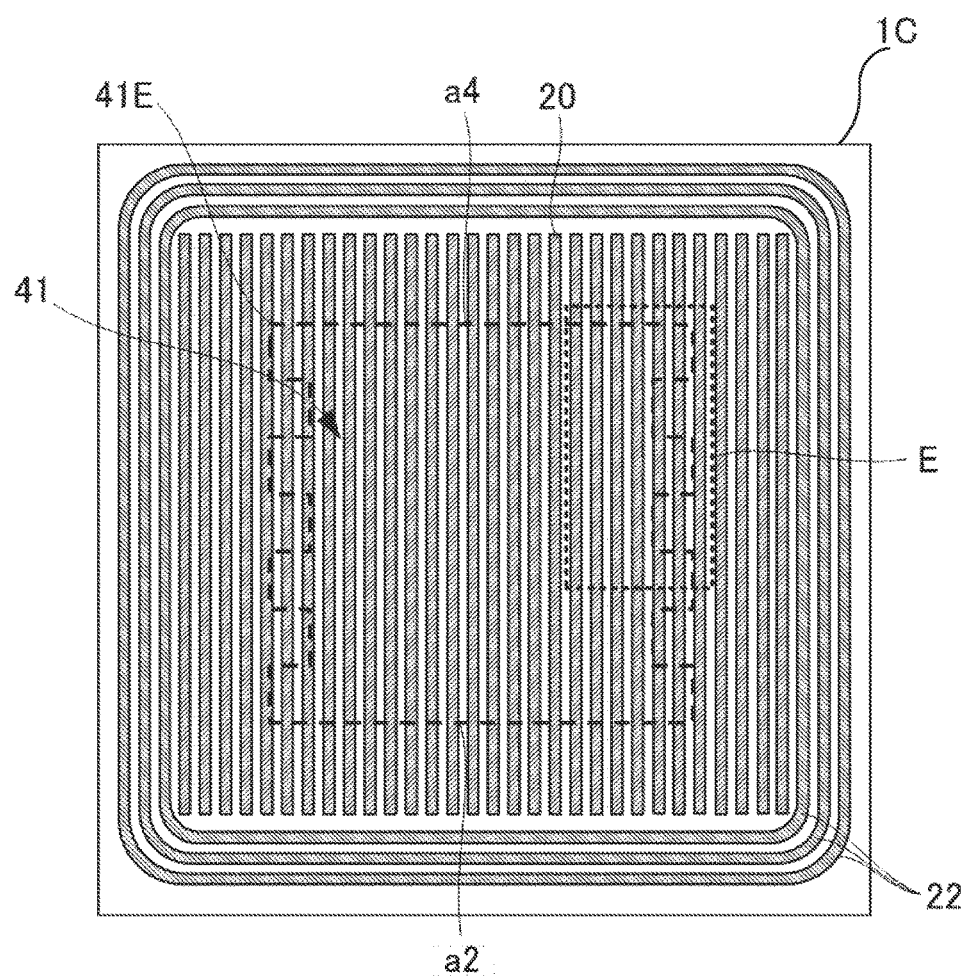
FIG. 10A is a plan view illustrating a configuration of a semiconductor device according to another exemplary embodiment of the present disclosure.
Figure 10B:
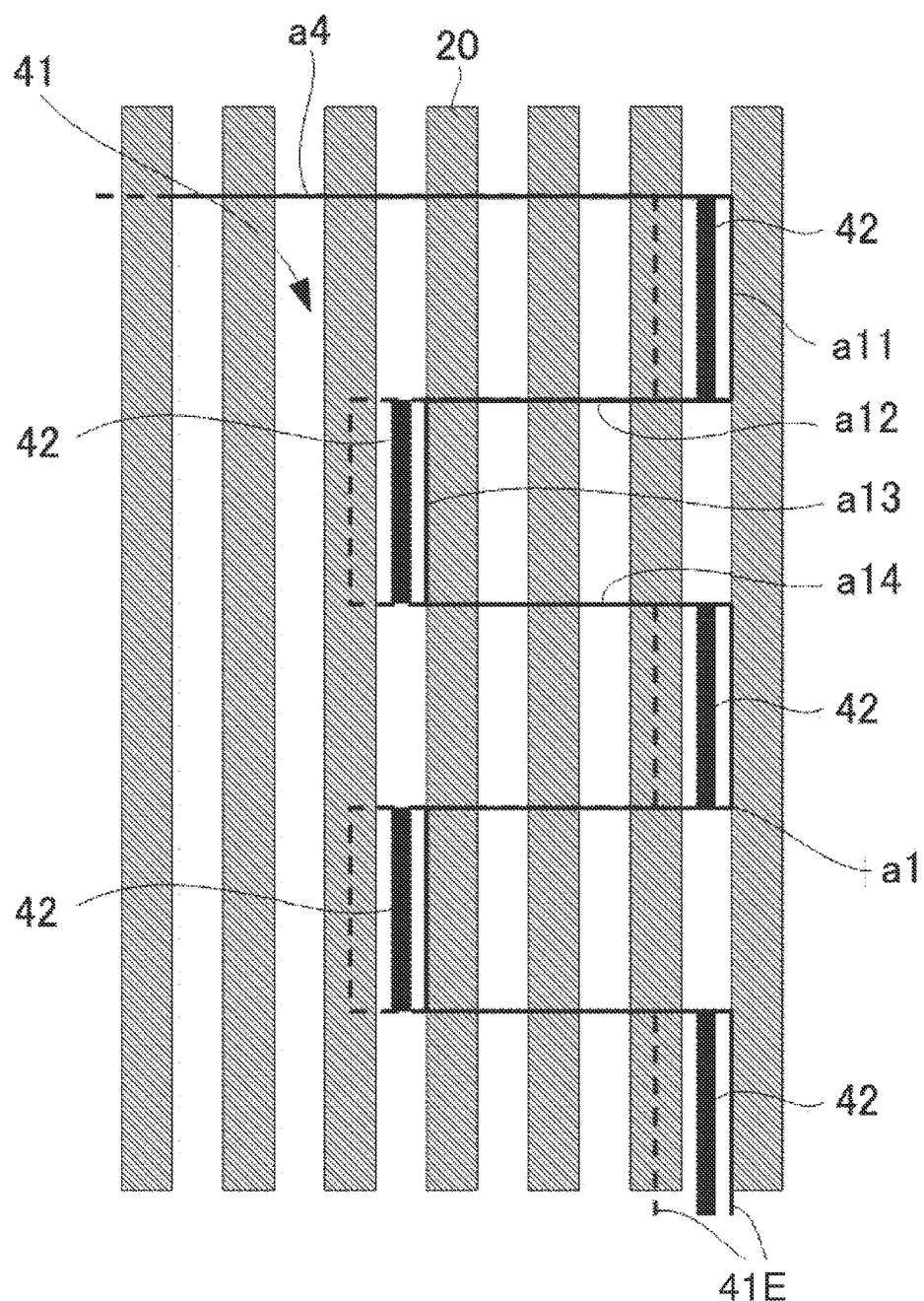
FIG. 10B is an enlarged view of a region E enclosed by the dashed line in FIG. 10A.

FIG. 10A is a plan view illustrating a configuration of a semiconductor device 1C according to a fourth exemplary embodiment of the present disclosure, and FIG. 10B is an enlarged view of a region E enclosed by the dashed line in FIG. 10A. In the semiconductor device 1C, the shape of the opening 41 of the protecting film 40 differs from that in the semiconductor device 1X according to the comparative example and that in the semiconductor device 1 according to the first exemplary embodiment. The configuration of the semiconductor device 1C is otherwise the same as that of the semiconductor device 1X according to the comparative example and the semiconductor device 1 according to the first exemplary embodiment. Further, in the semiconductor device 1C, the method of forming the protecting film 40 is the same as in the semiconductor device 1X according to the comparative example and the semiconductor device 1 according to the first exemplary embodiment described above. Note that although the conductive film 30 is omitted from illustration in FIG. 10A and FIG. 10B, the conductive film 30 is formed on the front face of the semiconductor substrate 10 so as to cover the gates 20. Further, the concave portions 31 of the conductive film 30 are formed in positions corresponding to between mutually adjacent gates 20, and extend in a direction parallel to the extension direction of the gates 20. Further, with regard to the protecting film 40, although only the opening end 41E, this being the outer edge of the opening 41, is illustrated in FIG. 10A and FIG. 10B, the protecting film 40 covers the front face of the conductive film 30 such that the conductive film 30 is partially exposed in the opening 41, similarly to in the semiconductor device 1X according to the comparative example.

In the semiconductor device 1C, the opening 41 of the protecting film 40 (the polyimide film 40a) includes the edge a1 and the edge a3 that extend in the extension direction of the concave portions 31 of the conductive film 30 (namely, the extension direction of the gates 20) while meandering so as to repeatedly intersect at least one out of the concave portions 31 of the conductive film 30, and also includes the edge a2 and the edge a4 that are perpendicular to the extension direction of the concave portions 31 of the conductive film 30 (namely, the extension direction of the gates 20). Namely, the opening end 41E of the protecting film 40 (the polyimide film 40a) is configured by the edge a1 to the edge a4.

In the semiconductor device 1C, the meandering edge a1 of the opening 41 of the protecting film 40 (the polyimide film 40a) has a square corrugated pattern configured by repeating pattern units composed of a first portion a11, a second portion a12, a third portion a13, and a fourth portion a14. The first portion a11 extends in a direction parallel to the extension direction of the concave portions 31 of the conductive film 30 (namely, the extension direction of the gates 20). The second portion a12 has one end connected to the first portion a11, faces toward the inside of the opening 41, and extends in a direction orthogonal to the extension direction of the concave portions of the conductive film 30. The third portion a13 has one end connected to another end of the second portion a12, and extends in a direction parallel to the extension direction of the concave portions 31 of the conductive film 30. The fourth portion a14 has one end connected to the third portion a13, faces the outer side of the opening 41, and extends in a direction orthogonal to the extension direction of the concave portions 31 of the conductive film 30. The edge a3 facing the edge a1 has the same square corrugated pattern as the edge a1.

In FIG. 10B, the correct position of the opening end 41E of the protecting film 40 (the polyimide film 40a) is indicated by the dashed line, and the position of the opening end 41E of the protecting film 40 (the polyimide film 40a) when not aligned with the correct position is indicated by the solid line. As illustrated in FIG. 10B, in the semiconductor device 1C, when the position of the opening end 41E of the protecting film 40 (the polyimide film 40a) is not aligned with the correct position, residue 42 of the protecting film 40 (the polyimide film 40a) may be produced in the square corrugated pattern of the edge a1, in the vicinity of the first portion a11 and the vicinity of the third portion a13 parallel to the extension direction of the concave portions 31 of the conductive film 30 (namely, the extension direction of the gates 20). Similarly, residue 42 of the protecting film 40 (the polyimide film 40a) may also be produced in the square corrugated pattern of the edge a3 facing the edge a1, in the vicinity of a portion parallel to the extension direction of the concave portions 31 of the conductive film 30 (namely, the extension direction of the gates 20).

However, the edge a1 and the edge a3 of the opening 41 of the protecting film 40 have square corrugated patterns as described above, such that the concave portions 31 of the conductive film 30 are interrupted by the square corrugated pattern and the length of residue 42 produced at any location will be shorter than the length of residue 42 produced in the semiconductor device 1X according to the comparative example. The length of residue 42 is accordingly shortened, such that the amount of contraction by the residue 42 during thermal curing of the protecting film 40 (the polyimide film 40a) is lessened. Further, in the semiconductor device 1C according to the present exemplary embodiment, both ends of the residue 42 are connected to the protecting film (the polyimide film 40a) at the outer side of the opening 41. Accordingly, the risk of residue 42 separating from the concave portions 31 of the conductive film 30 and becoming string-like is lowered. As long as residue 42 remains inside the concave portions 31 of the conductive film 30, issues such as the wire bonding deficiency described above will not occur.

Figure 11:
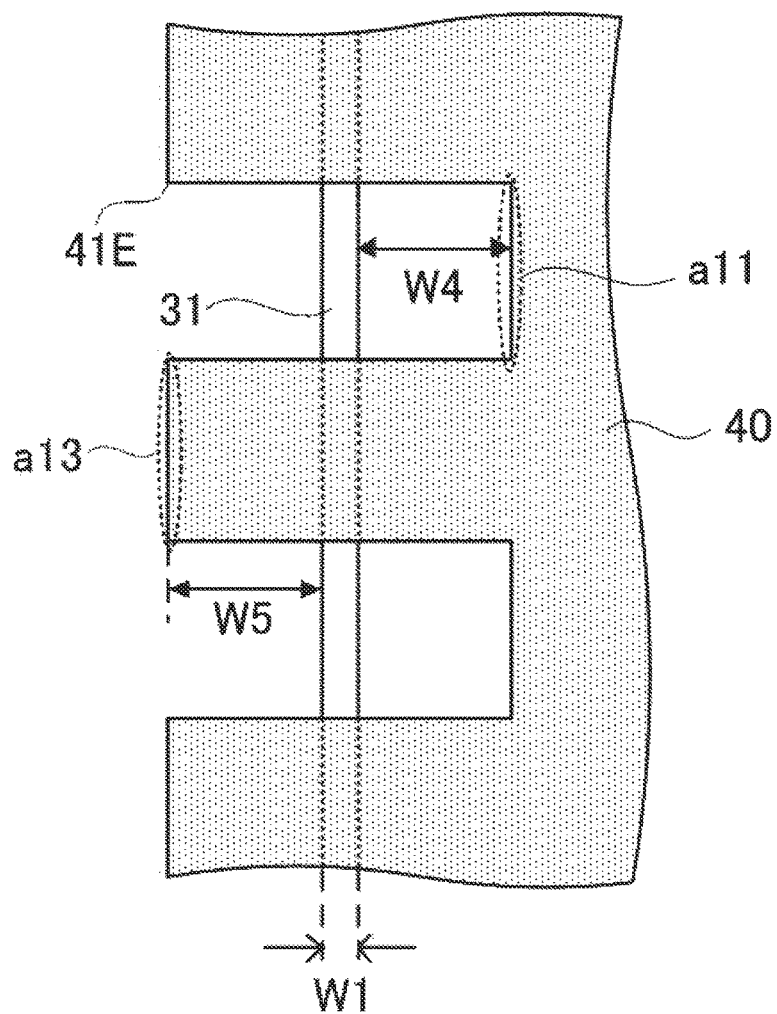
FIG. 11 is a plan view illustrating a relative positional relationship between a square corrugated pattern of an opening of a protecting film and concave portions formed in the front face of a conductive film in the opening of the protecting film according to an exemplary embodiment of the present disclosure.

FIG. 11 is a plan view illustrating relative positional relationships between the square corrugated pattern of the edge a1 of the opening 41 of the protecting film 40 and the concave portions 31 of the conductive film 30. A distance W4 between the first portion a11 of the edge a1 and the concave portions 31 of the conductive film 30 and a distance W5 between the third portion a13 of the edge a1 and the concave portions 31 of the conductive film 30 are each preferably no less than twice the width W1 of the concave portions 31 of the conductive film 30. Namely, 2W1<W4 and 2W1<W5 are preferably satisfied. The same applies for the relative positional relationship between the zig-zag pattern of the edge a3 and the concave portions 31 of the conductive film 30. Setting each of the distances W4 and W5 between the concave portions 31 of the conductive film 30, and the first portion a11 and the third portion a13 in the square corrugated pattern to no less than twice the width W1 of the concave portions 31 of the conductive film 30 makes it easy for developer fluid to enter from both sides of the concave portions 31 of the conductive film 30 disposed in the vicinity of the first portion a11 and the third portion a13 of the square corrugated pattern and promotes removal of the residue 42.

Note that, in the first exemplary embodiment to the fourth exemplary embodiment above, although examples have been given in which the semiconductor device 1, 1A, 1B, 1C is a power MOSFET, there is no limitation thereto. For example, the semiconductor device 1, 1A, 1B, 1C may be another semiconductor device such as an IGBT. Further, although examples have been given in which the concave portions 31 are formed in the front face of the conductive film 30 as a result of the gates formed on the front face of the semiconductor substrate 10, the concave portions 31 formed in the front face of the conductive film 30 may result from a structure other than gates. Further, although an example has been given in which polyimide is employed as the material of the protecting film 40, there is no limitation thereto. The protecting film 40 may be configured by an insulator other than polyimide.

What is claimed is:

1. A semiconductor device comprising:
   a semiconductor substrate;
   a conductive film covering a front face of the semiconductor substrate, a front face of the conductive film having a plurality of straight-line shaped concave portions disposed in parallel to each other; and
   a protecting film covering the front face of the conductive film, the protecting film having an opening that has an edge extending along a virtual straight line forming an angle with the plurality of concave portions of greater than 0° and less than 90°, and that partially exposes the conductive film.

2. The semiconductor device of claim 1, wherein a shape of the opening is a quadrilateral having two mutually opposing edges including the edge that form an angle with the plurality of concave portions of greater than 0° and less than 90°, and having another two mutually opposing edges that are orthogonal to the plurality of concave portions.

3. The semiconductor device of claim 1, wherein a shape of the opening is a quadrilateral having two mutually opposing edges including the edge that form an angle with the plurality of concave portions of greater than 0° and less than 90°, and having another two edges that form an angle with the plurality of concave portions of greater than 0° and less than 90°.

4. The semiconductor device of claim 1, wherein the edge runs along the plurality of concave portions and has a meandering shape that repeatedly intersects with at least one of the plurality of concave portions.

5. The semiconductor device of claim 4, wherein the edge having the meandering shape has a zig-zag pattern formed from a plurality of edges that each form an angle with the plurality of concave portions of greater than 0° and less than 90°.

6. The semiconductor device of claim 1, wherein
   the semiconductor device further includes a plurality of structures provided at the front face of the semiconductor substrate, the plurality of structures having straight-line shapes running along each of the plurality of concave portions and being covered by the conductive film; and
   the plurality of concave portions are formed as a result of undulations formed in the front face of the semiconductor substrate by the plurality of structures.

7. The semiconductor device of claim 6, wherein the plurality of structures comprise gates of transistors formed on the semiconductor substrate.

8. The semiconductor device of claim 1, wherein the semiconductor substrate comprises a substrate layer and an epitaxial layer stacked onto the substrate layer.

9. The semiconductor device of claim 1, further comprising a rear face electrode provided at a back face of the semiconductor substrate, the back face on a side of the semiconductor substrate opposite to the front face covered by the conductive film.

10. A semiconductor device comprising:
   a semiconductor substrate;
   a conductive film covering a front face of the semiconductor substrate, a front face of the conductive film having a plurality of straight-line shaped concave portions disposed in parallel to each other; and
   a protecting film covering the front face of the conductive film and including an opening having an edge that runs along a virtual straight line extending parallel to the plurality of concave portions and that has a meandering shape that repeatedly intersects with at least one of the plurality of concave portions.

11. The semiconductor device of claim 10, wherein the edge having the meandering shape has a square corrugated pattern configured by a repeating pattern unit formed of
   a first portion extending parallel to the plurality of concave portions;
   a second portion, having one end connected to the first portion and extending, in a direction orthogonal to the plurality of concave portions, toward an inner side of the opening;
   a third portion, having one end connected to another end of the second portion and extending parallel to the plurality of concave portions; and
   a fourth portion, having one end connected to the third portion and extending, in the direction orthogonal to the plurality of concave portions, toward an outer side of the opening.

* * * * *